(12) United States Patent
Shugrue et al.

(10) Patent No.: US 10,900,122 B2
(45) Date of Patent: Jan. 26, 2021

(54) APPARATUS FOR SEMICONDUCTOR WAFER PROCESSING

(71) Applicant: ASM IP Holding B.V., Almere (NL)

(72) Inventors: John Shugrue, Phoenix, AZ (US); Lucian C. Jdira, Nieuw Vennep (NL); Chris G. M. de Ridder, Almere (NL)

(73) Assignee: ASM IP Holding B.V., Almere (NL)

( * ) Notice: Subject to any disclaimer, the term of this patent is extended or adjusted under 35 U.S.C. 154(b) by 71 days.

(21) Appl. No.: 16/304,526

(22) PCT Filed: May 27, 2016

(86) PCT No.: PCT/NL2016/050382
§ 371 (c)(1),
(2) Date: Nov. 26, 2018

(87) PCT Pub. No.: WO2017/204622
PCT Pub. Date: Nov. 30, 2017

(65) Prior Publication Data
US 2019/0316255 A1    Oct. 17, 2019

(51) Int. Cl.
C23C 16/40 (2006.01)
C23C 16/455 (2006.01)
C23C 16/44 (2006.01)

(52) U.S. Cl.
CPC .... *C23C 16/45544* (2013.01); *C23C 16/4412* (2013.01); *C23C 16/45508* (2013.01); *C23C 16/45565* (2013.01)

(58) Field of Classification Search
CPC .......... C23C 16/45544; C23C 16/4412; C23C 16/45508; C23C 16/45565;
(Continued)

(56) References Cited

U.S. PATENT DOCUMENTS 4,792,378 A    12/1988 Rose et al.
8,334,015 B2   12/2012 Chiang et al.
(Continued)

FOREIGN PATENT DOCUMENTS

JP    2009/191311 A    8/2009
JP    2010/239102 A    10/2010
(Continued)

OTHER PUBLICATIONS

International Search Report and the Written Opinion of the International Searching Authority, dated Feb. 24, 2017, from counterpart International Application No. PCT/NL2016/050382, filed on May 27, 2016.

*Primary Examiner* — Rudy Zervigon
(74) *Attorney, Agent, or Firm* — Preti Flaherty Beliveau & Pachios LLP

(57) ABSTRACT

A spatial atomic layer deposition apparatus (10), including a showerhead (16) with a showerhead side (18) having a center, a central area and a circumferential area. The apparatus also includes a susceptor (12) having a substrate support side that extends parallel to and of opposite the showerhead side forming a gap. The susceptor and the showerhead are rotatable relative to each other around an axis of rotation. The apparatus has a plurality of switchable showerhead sections. The apparatus also includes a plurality of multi-way valve assemblies. Each switchable showerhead section is fluidly connected with one of the plurality of multi-way valve assemblies, so as to fluidly connect a selected one of a plurality of different gas sources with that switchable showerhead section.

20 Claims, 22 Drawing Sheets

(58) Field of Classification Search
CPC ........ C23C 16/45574; C23C 16/45561; C23C 16/45551; C23C 16/4584; H01L 21/67017; H01L 21/683
USPC ............. 118/715; 156/345.1, 345.33, 345.34
See application file for complete search history.

(56) References Cited

U.S. PATENT DOCUMENTS

| | | |
|---|---|---|
| 8,440,259 B2 | 5/2013 | Chiang et al. |
| 10,480,073 B2 | 11/2019 | Murakawa |
| 2004/0099213 A1* | 5/2004 | Adomaitis ............... C23C 16/52 118/715 |
| 2005/0249876 A1* | 11/2005 | Kawahara ......... C23C 16/45531 427/255.34 |
| 2009/0061083 A1 | 3/2009 | Chiang et al. |
| 2009/0324826 A1 | 12/2009 | Kato et al. |
| 2012/0149209 A1 | 6/2012 | Haywood et al. |

FOREIGN PATENT DOCUMENTS

| | | |
|---|---|---|
| JP | 2010/538498 A | 12/2010 |
| JP | 2014/201804 A | 10/2014 |
| WO | 2014/168096 A1 | 10/2014 |

\* cited by examiner

APPARATUS FOR SEMICONDUCTOR WAFER PROCESSING

BACKGROUND

State of the art spatial ALD tools typically operate utilizing showerheads with fixed sized process zones, each process zone injecting a certain process gas or a purge gas and a susceptor that is rotating relative to the showerhead. An example of an ALD tool with a showerhead is shown in FIG. 2 of U.S. Pat. No. 6,821,563. The rotation speed in combination with the size of the process zone results in a certain exposure time of the process gas injected in the process zone for a substrate moving relative to the showerhead. In U.S. Pat. No. 6,821,563 the size of process zones is fixed.

SUMMARY OF THE INVENTION

The optimal size distribution of each these zones is dependent on the required exposure times of the utilized process gases as one process gas may need a different exposure time than another process gas to achieve full saturation. A showerhead with process zones having a fixed size might result in an optimal throughput for a certain combination of process gases. However when utilizing the same showerhead for another combination of process gases, the throughput might not be optimal and/or process gas might be wasted by exposure times that are longer than what is needed to reach saturation.

It is the objective of this invention to provide a showerhead that has process zones that, in use, are adjustable in size.

To that end, the invention provides a spatial atomic layer deposition (SALD-) apparatus, including:
- a susceptor having a substrate support surface on which substrates can be placed; and
- a showerhead having a showerhead side that extends substantially parallel to the substrate support surface to form a gap between the substrate support surface and the showerhead side;
- wherein the susceptor and the showerhead are rotatable relative to each other around an axis of rotation that intersects a center of the showerhead and that extends substantially perpendicularly to the substrate support surface;
- wherein the showerhead includes a plurality gas channels, wherein each gas channel is fluidly connected with at least one showerhead opening in the showerhead that opens into the gap for supplying gas into and/or exhausting gas from the gap, wherein each gas channel with the at least one opening to which it is fluidly connected defines a showerhead section so that the showerhead includes a plurality of showerhead sections;
- wherein the SALD-apparatus comprises a plurality of multi-way valve assemblies, each multi-way valve assembly being fluidly connected to one gas channel of the plurality of gas channels of the showerhead, wherein each multi-way valve assembly is switchable to fluidly connect the respective gas channel that is fluidly connected to the multi-way valve assembly with a selected one of a plurality of different gas sources which supply different types of gas.

An advantage of the SALD-apparatus according to the invention is that each gas channel which is fluidly connected with a multi-way valve assembly can be selectively connected to different gas sources for supplying different types of gases via that gas channel and the associated showerhead section to the gap. This can be achieved by simply switching the multi-way valve assembly belonging to a respective showerhead section. As a result, process zones may be formed that each comprise one switchable showerhead section or a plurality of switchable showerhead sections. The size of a process zone can be easily varied by varying the number of switchable sections that are connected to the same gas source by means of appropriate switching of the multi-way valve assemblies. As a consequence, the exposure time can be optimized per process gas and, consequently the throughput and/or gas usage per substrate can be optimized by adjusting the size of the process zones through selection of the number of adjacent switchable showerhead sections that are connected to a certain gas source.

In an embodiment, each multi-way valve assembly may be switchable to fluidly connect the respective gas channel that is fluidly connected to the respective multi-way valve assembly with a gas exhaust. Accordingly, the function of a switchable showerhead section can be changed from gas supply section to gas exhaust section. This provides the possibility to vary the size and the separation between process zones even more freely.

Various embodiments are claimed in the dependent claims, which will be further elucidated with reference to some examples shown in the figures. The embodiments may be combined or may be applied separate from each other.

DETAILED DESCRIPTION

Figure 1:
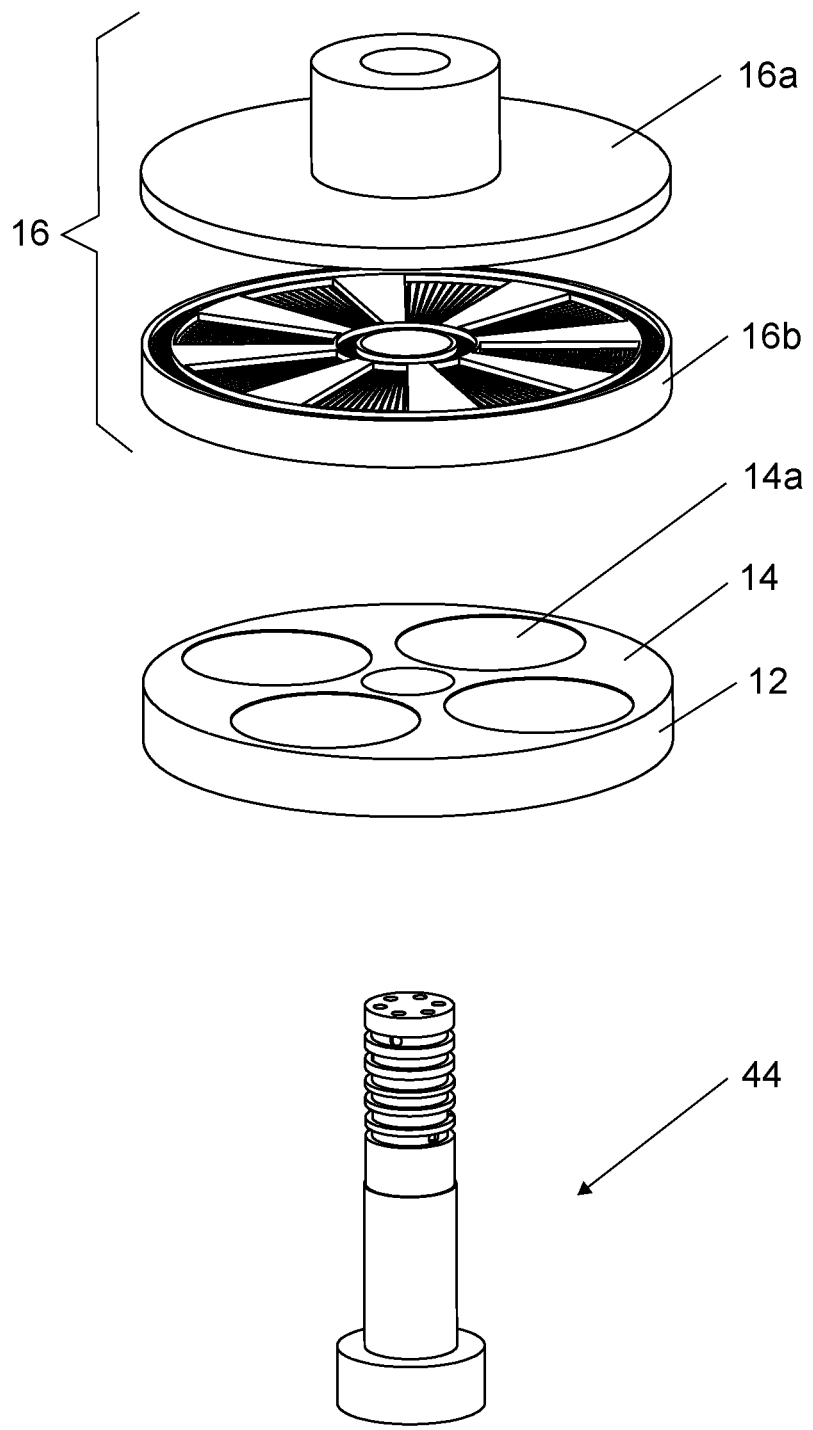
FIG. 1 shows an exploded perspective view of the SALD-apparatus slightly from above.

In this application similar or corresponding features are denoted by similar or corresponding reference signs. The description of the various embodiments is not limited to the examples shown in the figures and the reference numbers used in the detailed description and the claims are not intended to limit the description of the embodiments. The reference numbers are included to elucidate the embodiments by referring to the examples shown in the figures.

FIGS. 1-13 relate to a first example of a spatial atomic layer deposition apparatus (hereafter SALD-apparatus). FIGS. 14-20 relate to a second example of a SALD-apparatus. Both examples include various embodiments and include the main aspect of the present invention. FIGS. 21-32 show examples of different gas supply configurations of the showerhead 10 that may be realized by connecting the various sections s1-s12 of the showerhead 16 to the various available gas sources 28-34 or to a gas exhaust 36, for example precursor A, precursor B, precursor C, purge P and an exhaust E.

Two examples of the SALD-apparatus 10 to which the present invention relates are shown in FIGS. 1-20. In general the SALD apparatus includes a susceptor 14 having a substrate support surface 14 on which substrates to be processed can be placed. The SALD-apparatus additionally includes a showerhead 16 having a showerhead side 18 that faces and extends substantially parallel to the substrate support surface 14 to form a gap 20 between the substrate support surface 14a and the showerhead side 18, see FIGS. 12, 13 and 19, 20. The susceptor 12 and the showerhead 16 are rotatable relative to each other around an axis of rotation A that intersects the center of the showerhead 16 and that extends substantially perpendicularly to the substrate support surface 14, see FIG. 7, 10. In an embodiment, of which the first example shown in FIGS. 1-13 is an example, the showerhead 16 is rotatable and the susceptor 12 is fixed in rotational direction or only intermittently rotatable, for example, for loading and unloading substrates on the susceptor 12. In an alternative embodiment, of which the second example shown in FIGS. 14-20 is an example, the showerhead 16 may be fixed in the rotational direction and the susceptor 12 may be rotatable.

As is clearly shown in FIGS. 7, 9, 19 and 20, the showerhead 16 includes a plurality gas channels 64, 68; 96'. Each gas channel is fluidly connected with at least one showerhead opening 22 in the showerhead 16 that opens into the gap 20 for supplying gas into and/or exhausting gas from the gap 20. Each gas channel with the at least one opening 22 to which it is fluidly connected defines a showerhead section s1-s12 so that the showerhead 16 includes a plurality of showerhead sections s1-s12. In the two examples shown in FIGS. 1-20, the number showerhead sections s1-s8 is eight. In the examples shown in FIGS. 21-32 the number of switchable showerhead sections s1-s12 is twelve. It should be noted that any number of showerhead sections s1-s12 is feasible be it that a higher number provides a improved flexibility with regard to the gas zones combinations that can be created. Typically, six gas sections will be a minimum. Each showerhead section s1-s12 determines a gap section that extends substantially radially from a central area adjacent the center of the showerhead side 18 to a circumferential area of the showerhead side 18. Generally, the section openings 22 will be provided in the showerhead side 18 as shown in FIGS. 2, 12, 8, 15, 17, 19. However, alternatively, the sections openings 22 may also be provided in a circumferential wall bounding the gap 20 adjacent a radial inner edge or a radial outer edge of the showerhead side 18.

In accordance with the invention, the SALD-apparatus 10 comprises a plurality of multi-way valve assemblies 24. Each multi-way valve assembly 24 is fluidly connected to one gas channel 64, 68 or 96' of the plurality of gas channels of the showerhead 16. Each multi-way valve assembly 24 is switchable to fluidly connect the respective gas channel 64, 68 or 96' that is fluidly connected to the multi-way valve assembly 24 with a selected one of a plurality of different gas sources 28, 30, 32, 34 which supply different types of gas.

In the examples shown in FIGS. 1-20, the showerhead 16 includes a gas supply plate 16a and a gas distribution plate 16b. In an alternative embodiment, the showerhead 16 may consist of a single part. In particular, this may be easily feasible when the showerhead 16 is rotatably fixed.

The advantages of the SALD-apparatus according to the invention have been described in the summary, to which reference is made.

Various embodiments of the showerhead 10 are possible. Each switchable section s1-s12 may for example be provided with a single row of section openings 22 that extend in radial direction from the central area to the circumferential area. However, the section openings 22 may also be provided in a triangular or wedge-shaped pattern to form the switchable showerhead sections s1-s12 as shown in the first example of FIGS. 1-13. In addition, a size of the section openings 22 may be varied within or between switchable showerhead sections s1-s8. Also the outflow direction of the section openings 22 may, apart from being perpendicular to the showerhead side 18 also be non-perpendicular, i.e. angled. By using different sizes of section openings 22 and/or differently angled section openings 22 at different locations within a section of the switchable showerhead sections s1-s8 in the showerhead side 18, the amount and direction of the gas flow supplied via the section openings 22 can be influenced. In an embodiment, the various sections s1-s8 may have mutually different section opening patterns, mutually different section opening dimensions or mutually different section opening angles.

In the following, the first and the second example shown in FIGS. 1-20 will be described. Subsequently, some programmability examples will be discussed with reference to FIGS. 21-32. Finally, various embodiments of the invention, as claimed in the dependent claims, will be discussed with reference to the figures.

Figure 2:
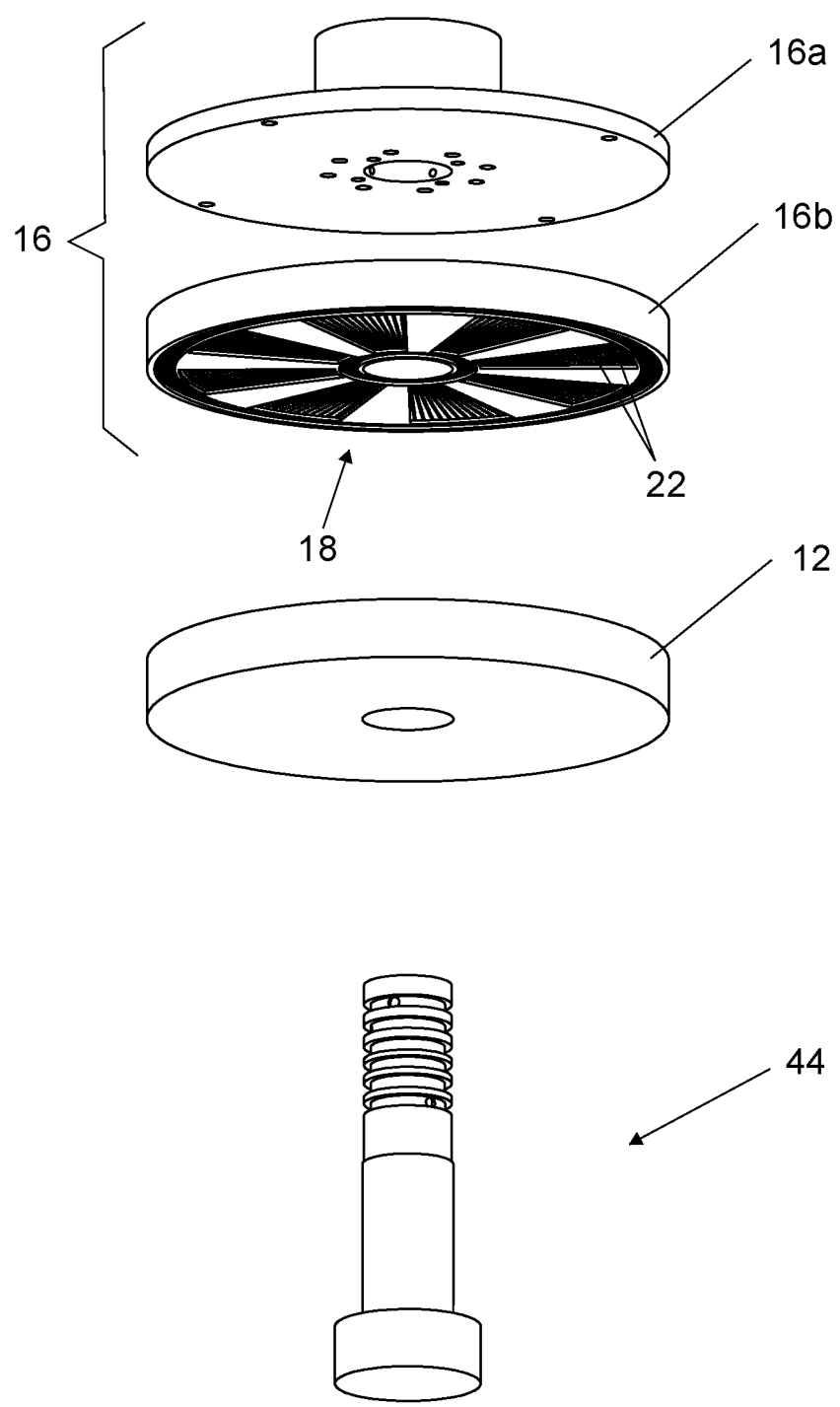
FIG. 2 shows an exploded perspective view of the SALD-apparatus of FIG. 1 slightly from below.
Figure 9:
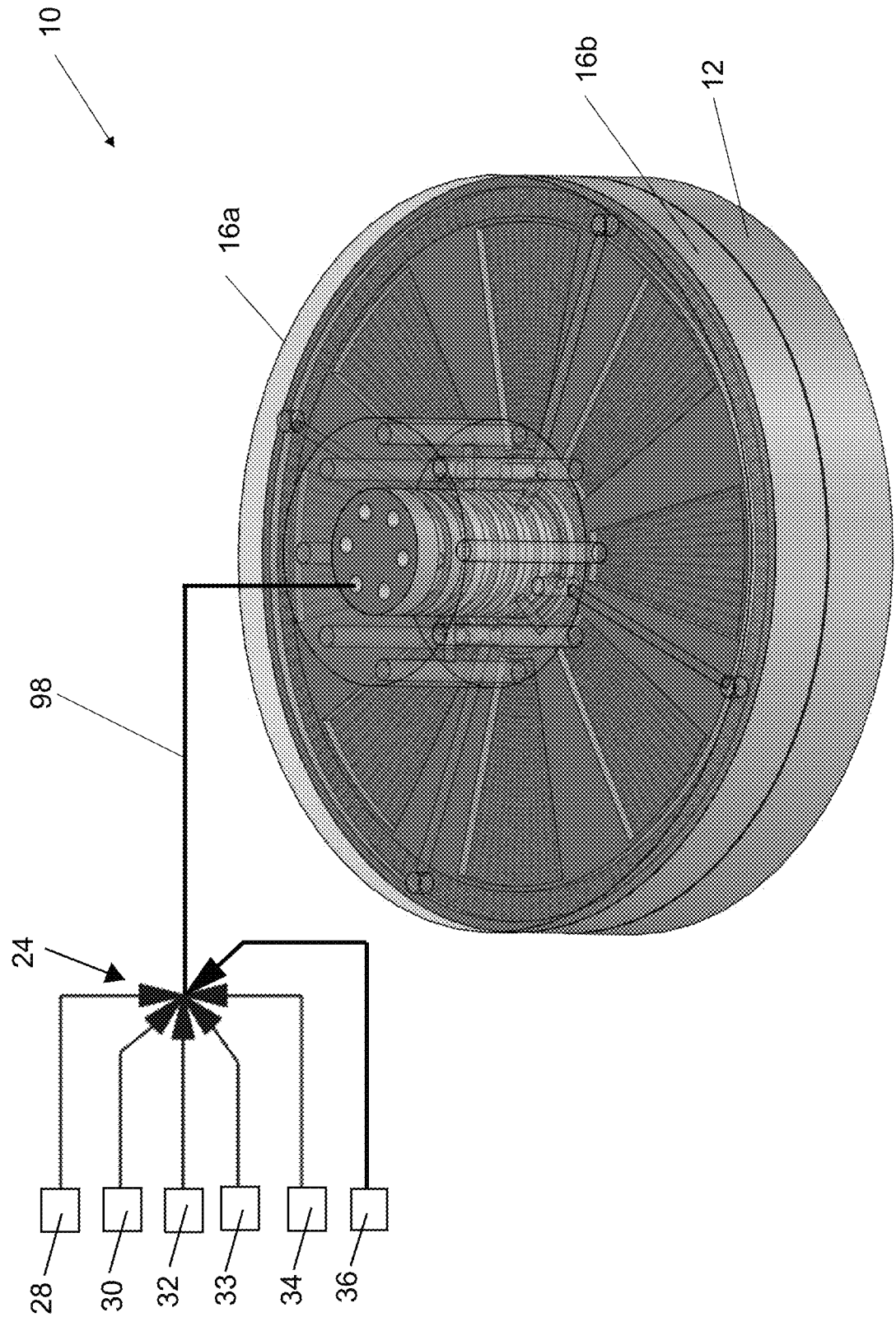
FIG. 9 shows a perspective view of the first example of a SALD-apparatus (SALD-apparatus) in the closed condition.
Figure 10:
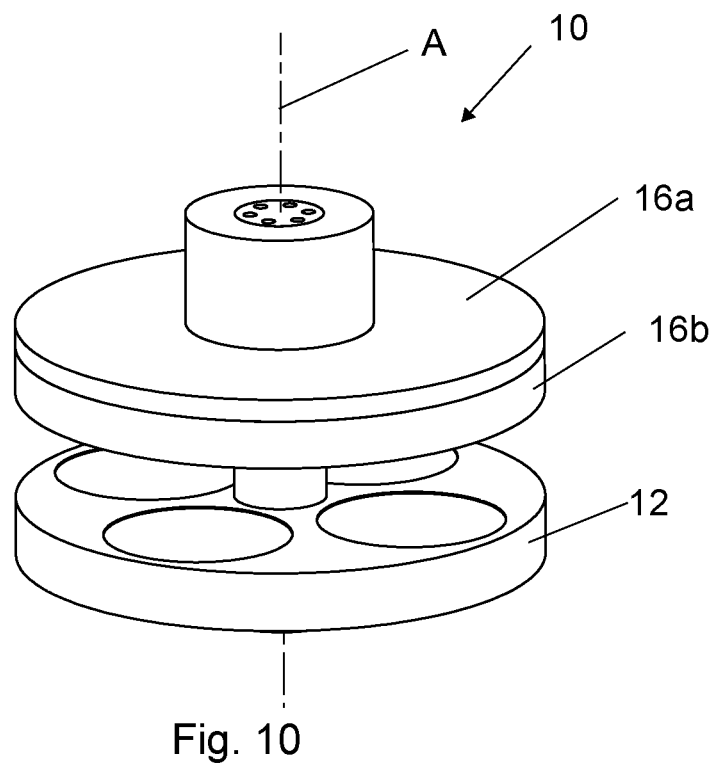
FIG. 10 shows a perspective view of the first example of the SALD-apparatus of FIGS. 1 and 2 in opened condition.

The first example as shown in FIGS. 1-13 includes, as clearly shown in FIGS. 1 and 2, a showerhead 16 comprising a gas supply plate 16a and a gas distribution plate 16b which are connected to each other and which are rotatably mounted on a stationary shaft 44. The susceptor 12 is also mounted on the shaft 44 and can move upwardly and downwardly on the shaft 44. Optionally, the susceptor 12 may be intermittently rotatable, for example for placing substrates on the substrate support surface 14 thereof, with a substrate handling robot which may be positioned next to the SALD-apparatus 10. In example of FIGS. 1-13, the substrate support surface 14 has four circular shaped cavities 14a in which a circular substrate may be positioned. In use, that is during the ALD-process, the showerhead 16 will rotate and the susceptor 12 will be stationary. The susceptor 12 will be moved upwardly in a closed position of the SALD-apparatus in which there is a small gap 20 between the substrate support surface 14 of the susceptor 12 and the showerhead side 18 which is directed to the substrate support surface 14. FIGS. 9 and 13 show the first example of the SALD-apparatus 10 in the closed condition. FIGS. 10 and 12 show the first example of the SALD-apparatus 10 in the opened condition.

Figure 3:
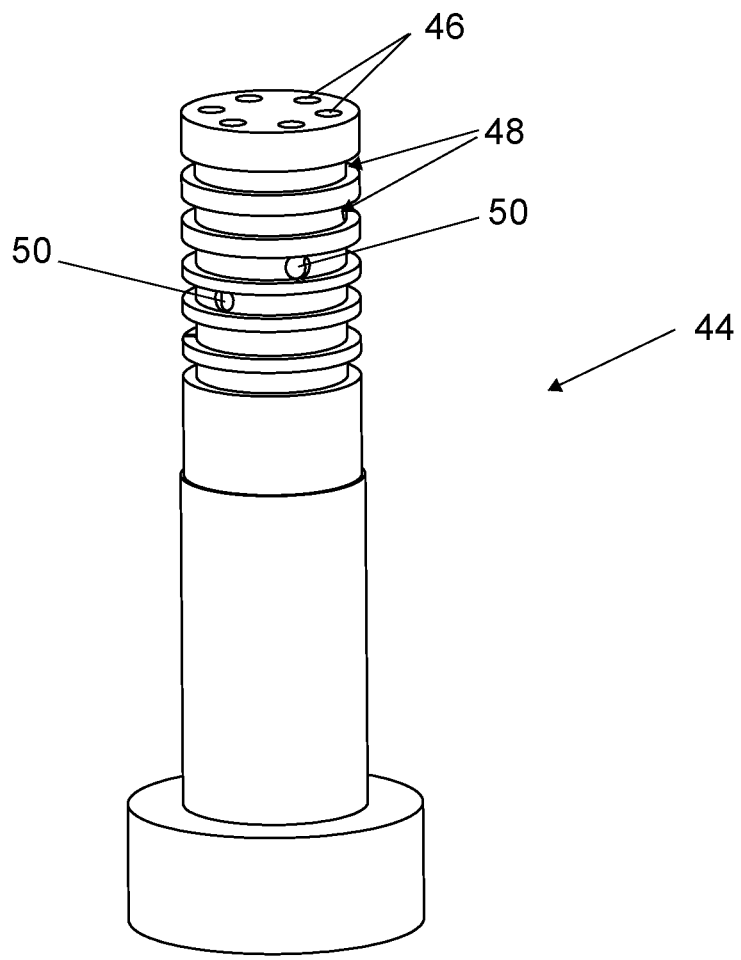
FIG. 3 shows a perspective view of the shaft of the first example of the SALD-apparatus of FIGS. 1 and 2.
Figure 4:
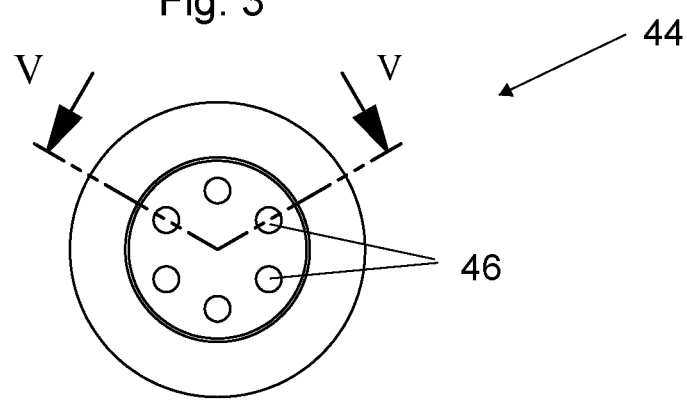
FIG. 4 shows a top view of the shaft of FIG. 3.
Figure 5:
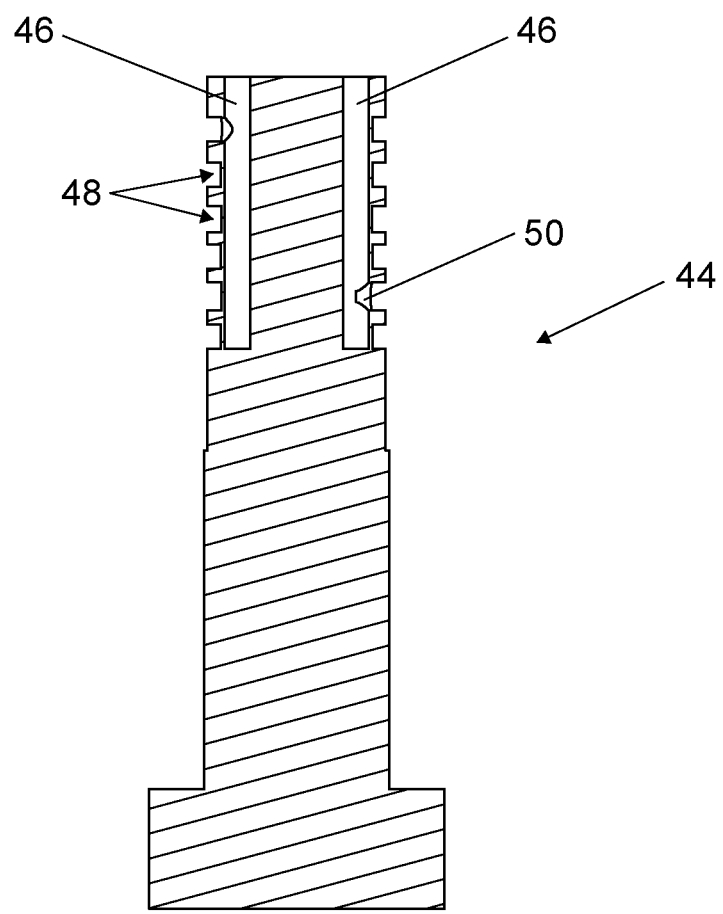
FIG. 5 shows a cross-sectional view of over line V-V of FIG. 4.

FIGS. 3-5 show the shaft 44 in more detail. The shaft is stationary and includes a number of axial channels 46 that extend parallel to the axis of the shaft. The axial channels 46 are connectable via gas lines to gas sources 28-34 and/or to an gas exhaust 36. On a plurality of axial levels of the shaft annular shaped grooves 48 are provided. In each groove 48 at least one transverse channel 50 opens. The transverse channel 50 fluidly connects a axial channel 46 with the annular groove 48 associated with that axial channel 46. Gas may be supplied to or exhausted from an annular groove 48 via transverse channel 50 and axial channel 46.

Figure 6:
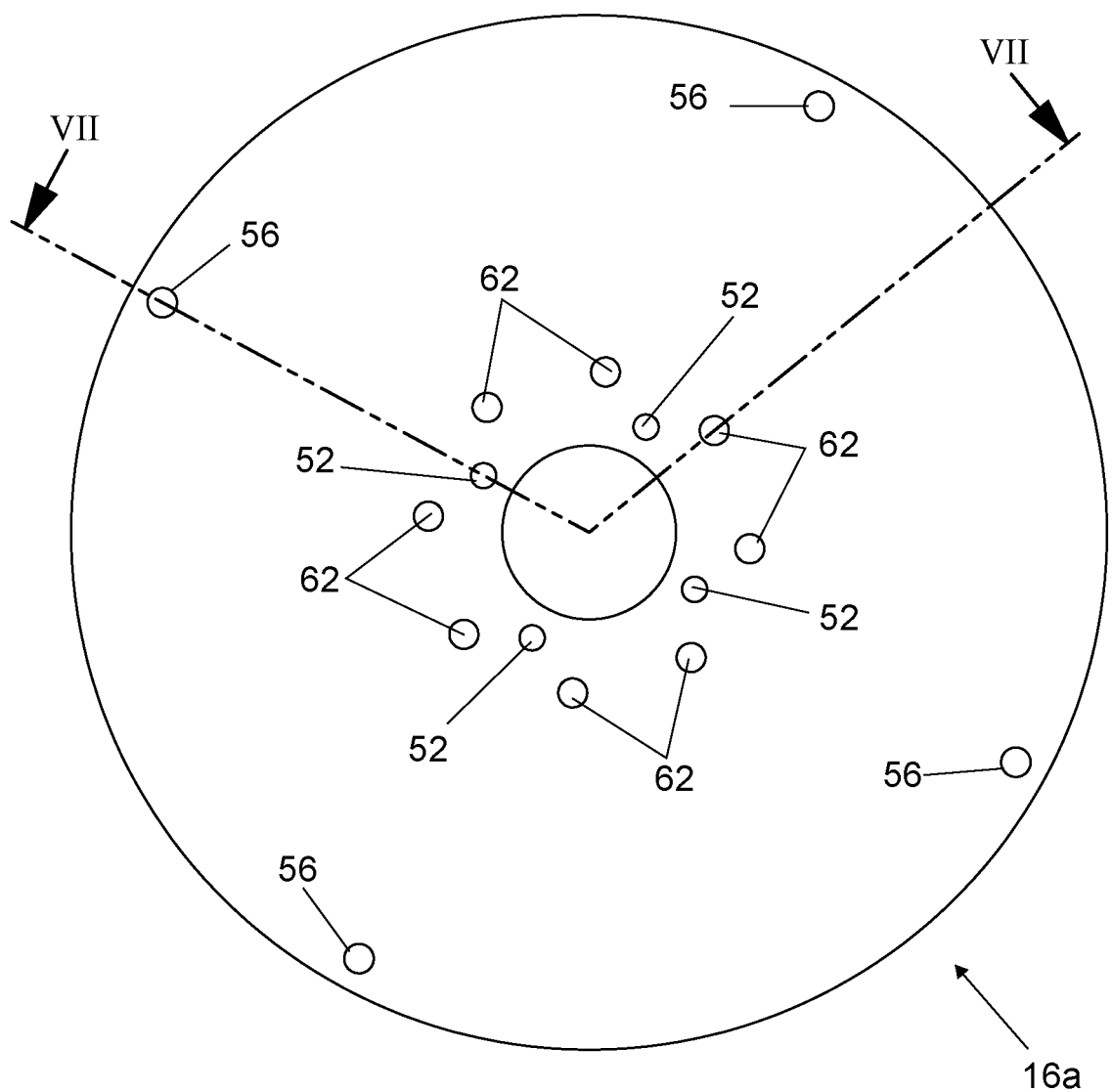
FIG. 6 shows a bottom view of a gas supply plate of the showerhead of the first example of the SALD-apparatus of FIGS. 1 and 2.
Figure 7:
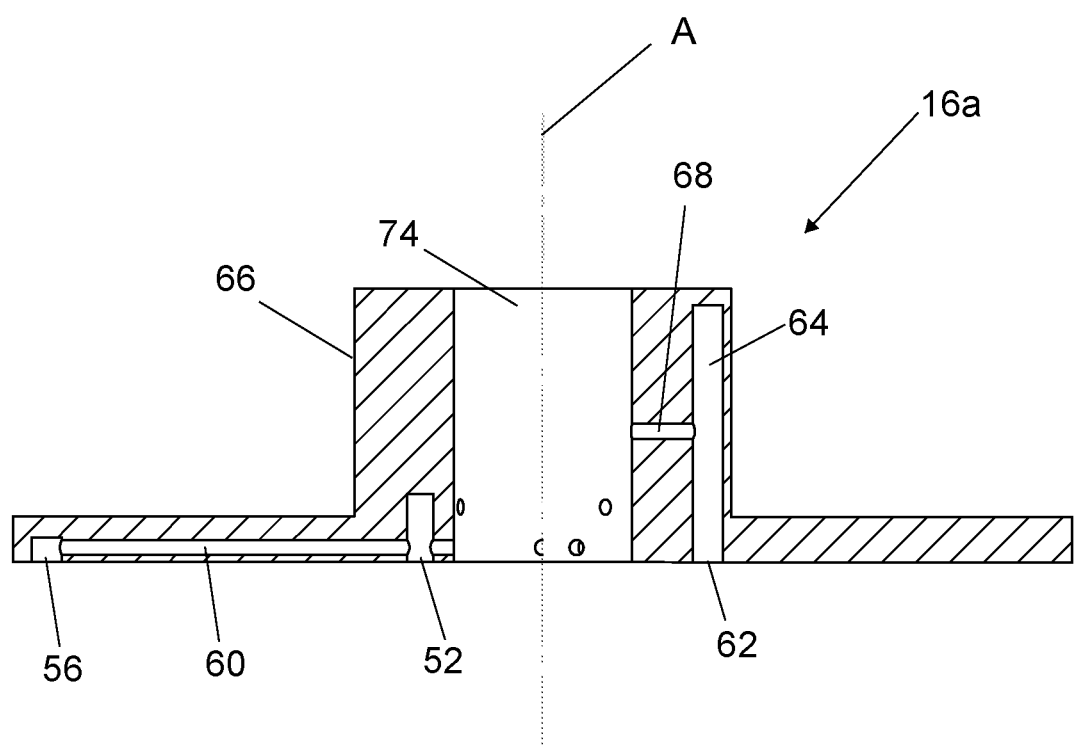
FIG. 7 shows a cross section of line VII-VII of FIG. 6.

FIGS. 6 and 7 show in more detail the gas supply plate 16a. FIG. 6 shows a bottom view of the gas supply plate 16a and FIG. 7 shows the cross sectional view over line VII-VII in FIG. 6.

Figure 8:
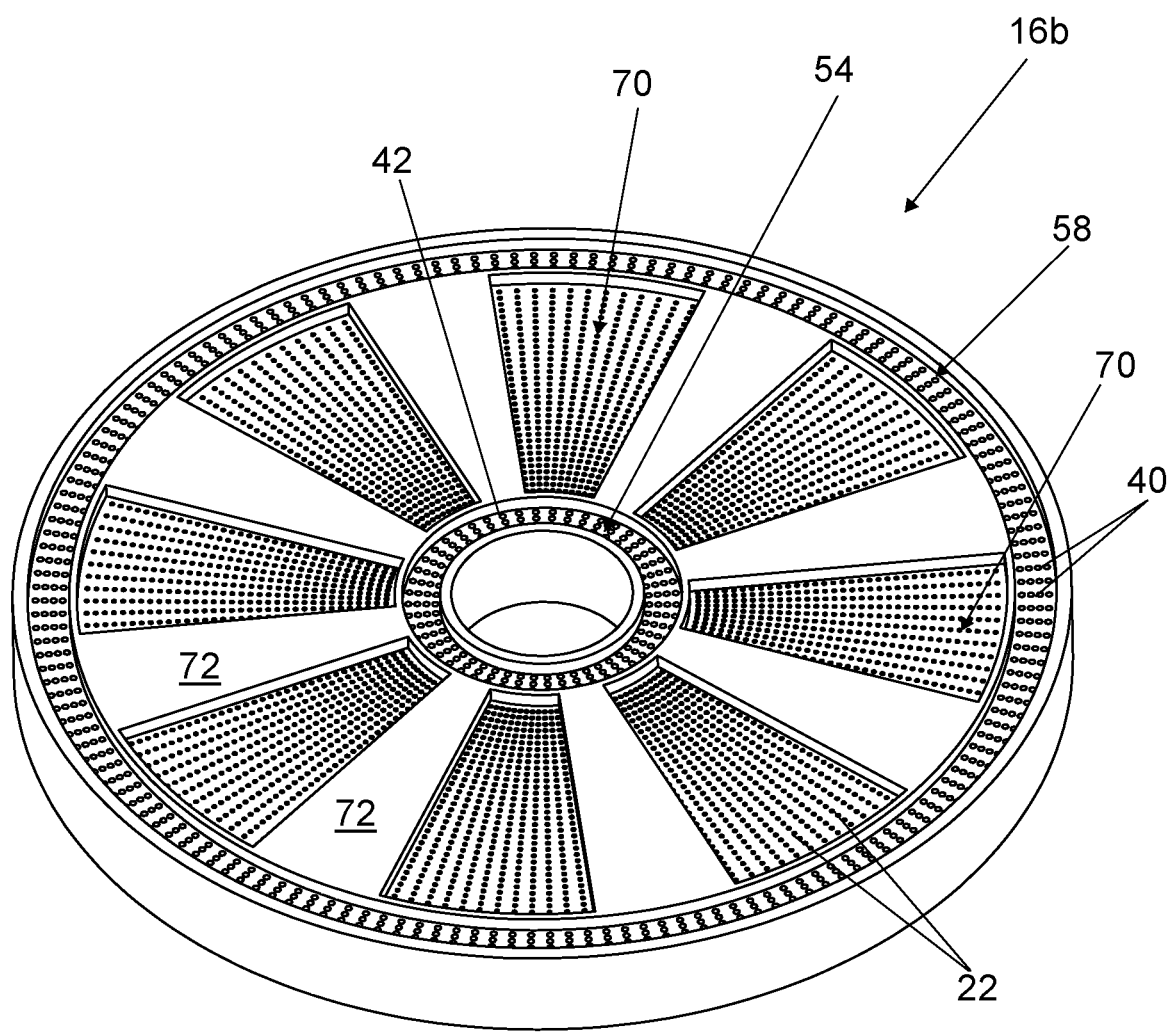
FIG. 8 shows a perspective view of the gas distribution plate of the showerhead of the example of FIGS. 1 and 2.

FIG. 8 shows a perspective view of the gas distribution plate 16b of the showerhead 16. As already mentioned, the gas supply plate 16a and the gas distribution plate 16b are in use fixedly connected to each other and together form the showerhead 16. In the first example the showerhead 16 is rotatably mounted on the shaft 44. The structure of the upper side of the gas distribution plate 16 is clearly visible in FIG. 8 and the structure of the opposite side, facing the susceptor 12, which will be referred to herein as showerhead side 18 is substantially the same.

As clearly shown in FIG. 6, the bottom of the gas supply plate 16a includes four openings 52 on a relatively small radius. These openings 52 open into a ring-shaped chamber 54 (see FIG. 8) of the gas distribution plate 16b in which inner ring openings 42 are provided. The bottom of the gas supply plate 16a also includes four openings 56 on a relatively large radius. These openings 56 open into a ring-shaped chamber 58 (see FIG. 8) of the gas distribution plate 16b in which outer ring openings 40 are provided. Instead of four openings 52 on the small radius and four openings 56 on the relatively large radius, any number of openings that suffices to supply or exhaust a sufficient flow of gas may be provided. As clearly visible in FIG. 7, the openings 52 and 56 are connected via a channel 60 extending radially. The radial channel 60 opens into a central opening 74 of the gas supply plate 16a. The central opening 74 accommodates the shaft 44 which extends through the central opening 74. The gas supply plate 16a includes a hub 66 through which the central opening 74 extends. The radial channel 60 is fluidly connected with one of the annular grooves 48 on the shaft 44. Consequently, for example purge gas may be supplied via an axial channel 46 in the shaft 44, via a transversal channel 50 to an annular groove 48 of the shaft 44. From this annular groove 48, the purge gas may be supplied to radial channel 60 and via radial channel 60 and openings 52 and 56 to the ring-shaped chamber 54 with the relatively small radius and the ring-shaped chamber 58 with the relatively large radius. The purge gas will pass the gas distribution plate 16b via the outer ring openings 40 and inner ring openings 42 so as to flow into the gap 20 between the showerhead side 18 and the substrate support surface 14 so as to form an inner ring section $s_i$ and an outer ring section $s_o$ (see FIGS. 21, 23, 25) within the gap 20 that are supplied with purge gas. Instead of supplying purge gas, the same route may also be used to exhaust gas from the inner ring section $s_i$ and the outer ring section $s_o$.

The bottom of the gas distribution plate 16b also includes eight openings 62 which are formed by gas channels 64 extending axially within the hub 66 of the gas supply plate 16a. Each axial gas channel 64 in the hub 66 is connected to a transversal gas channel 68 in the hub 66 that extends to the central opening 74. Each transversal gas channel 68 in the hub 66 is associated with one of the annular grooves 48 on the shaft 44. Each opening 62 in the bottom of the gas supply plate 16b is associated with a section chamber 70 on the top side of the gas distribution plate 16b. The section chambers 70 are separated from each other by radial ribs 72. In FIG. 8, the ribs 72 are quite wide, of similar dimension as the section chambers 70 but the ribs can also be relatively thin, of much smaller dimension in transversal direction than the section chambers 70. In each section chamber 70 section openings 22 are provided which extend from the top side of the gas distribution plate 16b to the bottom side which forms the showerhead side 18. Thus within the gap 20 switchable showerhead section s1-s8 are present to which a gas may be supplied or from which gas may be exhausted. Supply of gas to a switchable showerhead section s1-s8 may be effected by supplying gas via the axially extending gas channels 46 and transversal gas channels 50 in the shaft 44 to the annular grooves 48 on the shaft 44. Subsequently, the gas supplied to the annular grooves will enter a transversal gas channel 68 in the hub 66 and one of the axial gas channels 64 within the hub 66. The gas will flow via the openings 62 in the bottom side of gas supply plate 16*b* in an associated section chamber 70. The gas will easily distribute within the section chamber 70 and subsequently pass the section openings 22 within that section chamber 70 to enter the gap 20 and fill a radially extending section within the gap 20. Alternatively, the same route may be used to exhaust gas from a radially extending section within the gap 20 by connecting one of the axially extending gas channels 46 within the shaft 44 with an exhaust, such as a vacuum pump.

FIG. 9 shows the first example in the closed condition. The gas supply plate 16*a* has been made transparent so that the gas channels extending therein and the top side of the gas distribution plate 16*b* are visible. From this FIG. 9 it is clear how the various openings 52, 56, 62 in the bottom side of the gas supply plate 16*a* are connected to the various chambers 54, 58, 70 on the top side of the gas distribution plate 16*b*. FIG. 9 schematically indicates that a gas conduit 98 is connected to the axially extending channel 46 in the shaft 44. This gas conduit 98 is connected to a multi-way valve assembly 24 via which the axially extending gas channel 46 can be connected to a gas source 28, 30, 32, 33, 34 of choice or to a gas exhaust 36. Each axially extending gas channel 46 is connected in a similar manner to an associated gas conduit 98 and an associated multi-way valve assembly 24 so as to be connectable to a selected one of the gas sources 28, 30, 32, 33, 34 or to a gas exhaust.

It should be noted that the first example only includes eight gas sections s1-s8. In practice, the number of gas sections will generally be higher.

FIG. 10 shows a perspective view of the first example in an opened condition. In this open state, substrates may be placed and/or removed from the susceptor 12. This may be effected manually or automatically with a pick-and-place robot.

Figure 11:
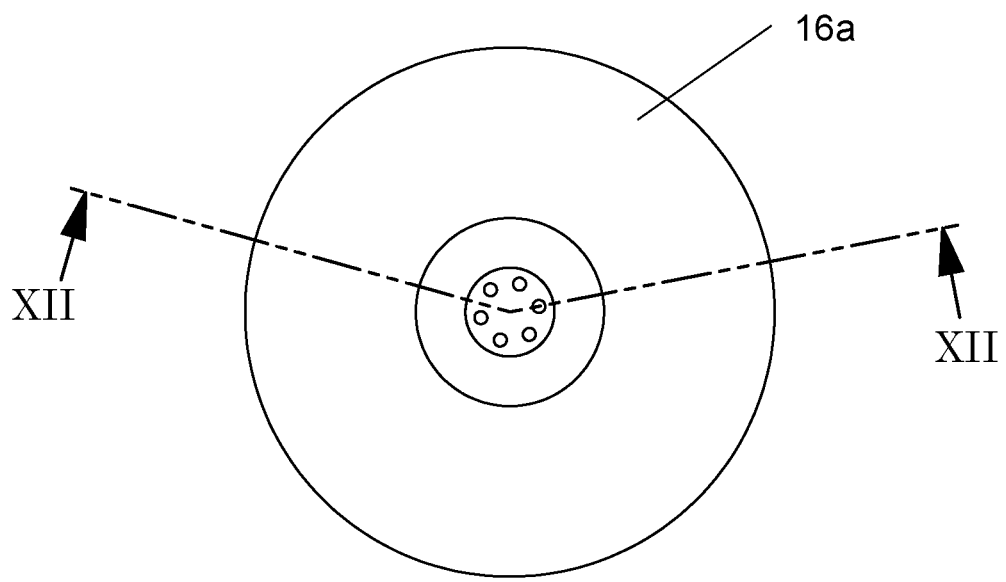
FIG. 11 shows a top view of the SALD-apparatus shown in FIG. 10.
Figure 12:
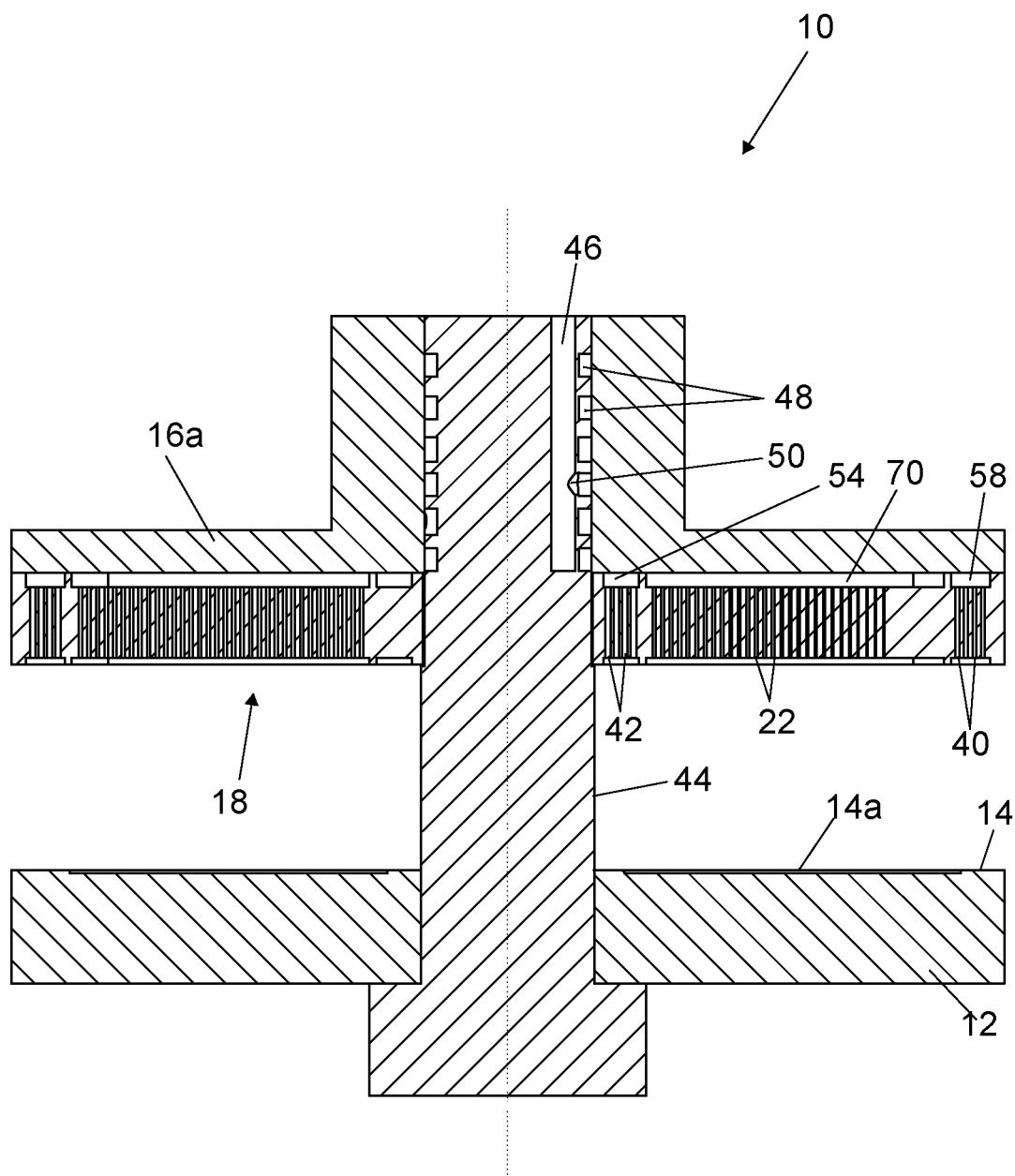
FIG. 12 shows a cross sectional view over line XII-XII in FIG. 11.
Figure 13:
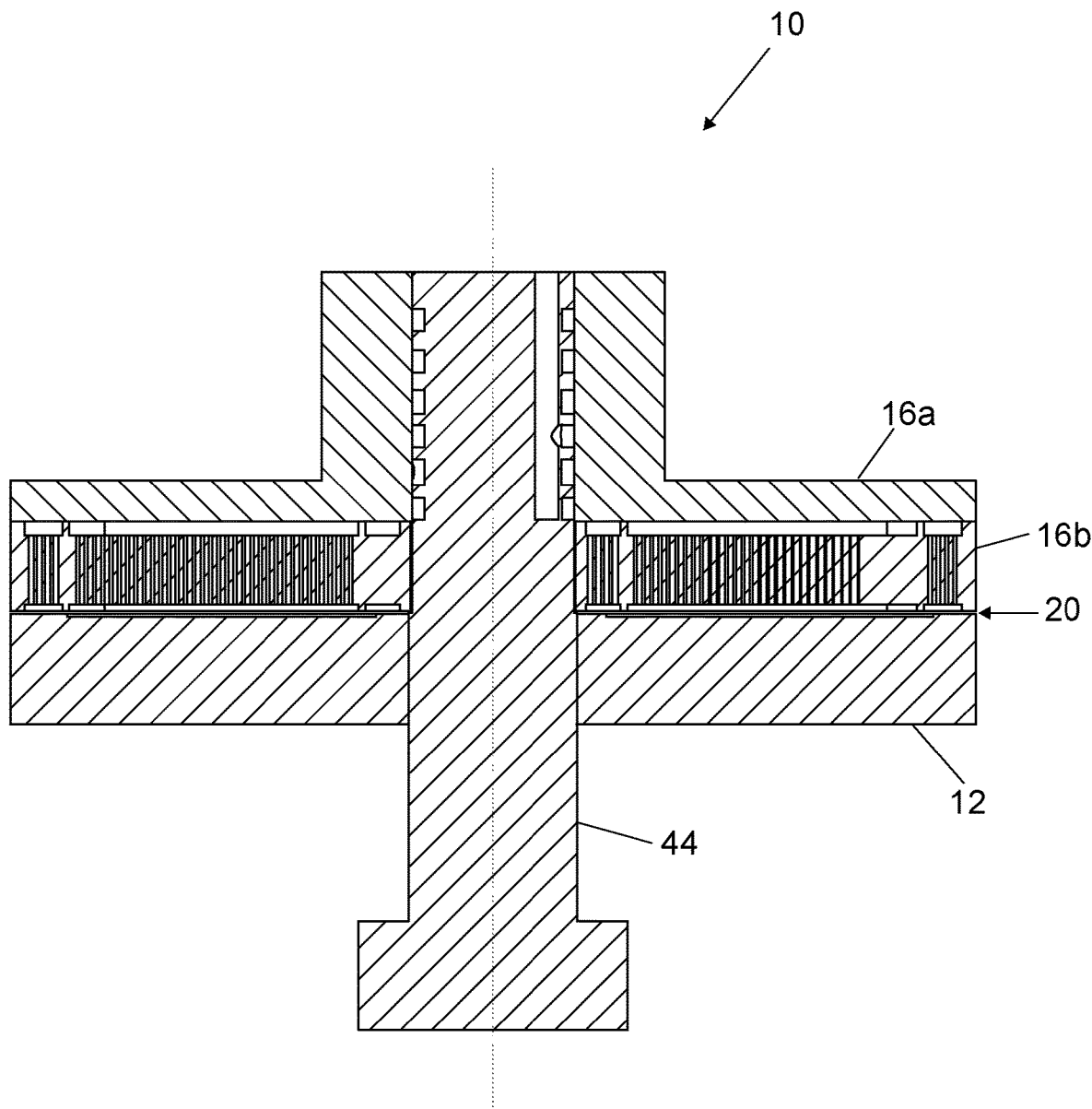
FIG. 13 shows a similar cross sectional view as shown in FIG. 12 but now with the SALD-apparatus in closed condition.

FIG. 11 shows a top view of the first example of the SALD-apparatus and indicates the section line XII-XII which indicates the section lines of the cross sectional views shown in FIGS. 12 and 13. In FIG. 12 the SALD-apparatus 10 is in the opened condition and in FIG. 13 the SALD-apparatus is in the closed condition.

FIGS. 14-20 show a second example of an SALD-apparatus 10 according to the invention. The various parts of the apparatus 10 of the second example are clearly shown in exploded views provided in FIGS. 14 and 15. In the second example the showerhead 16 is stationary and the susceptor 12 rotates during the ALD-process. Additionally, instead of a top down flow of gas within each section, the main direction of the flow within each section is radially inwards.

Figure 14:
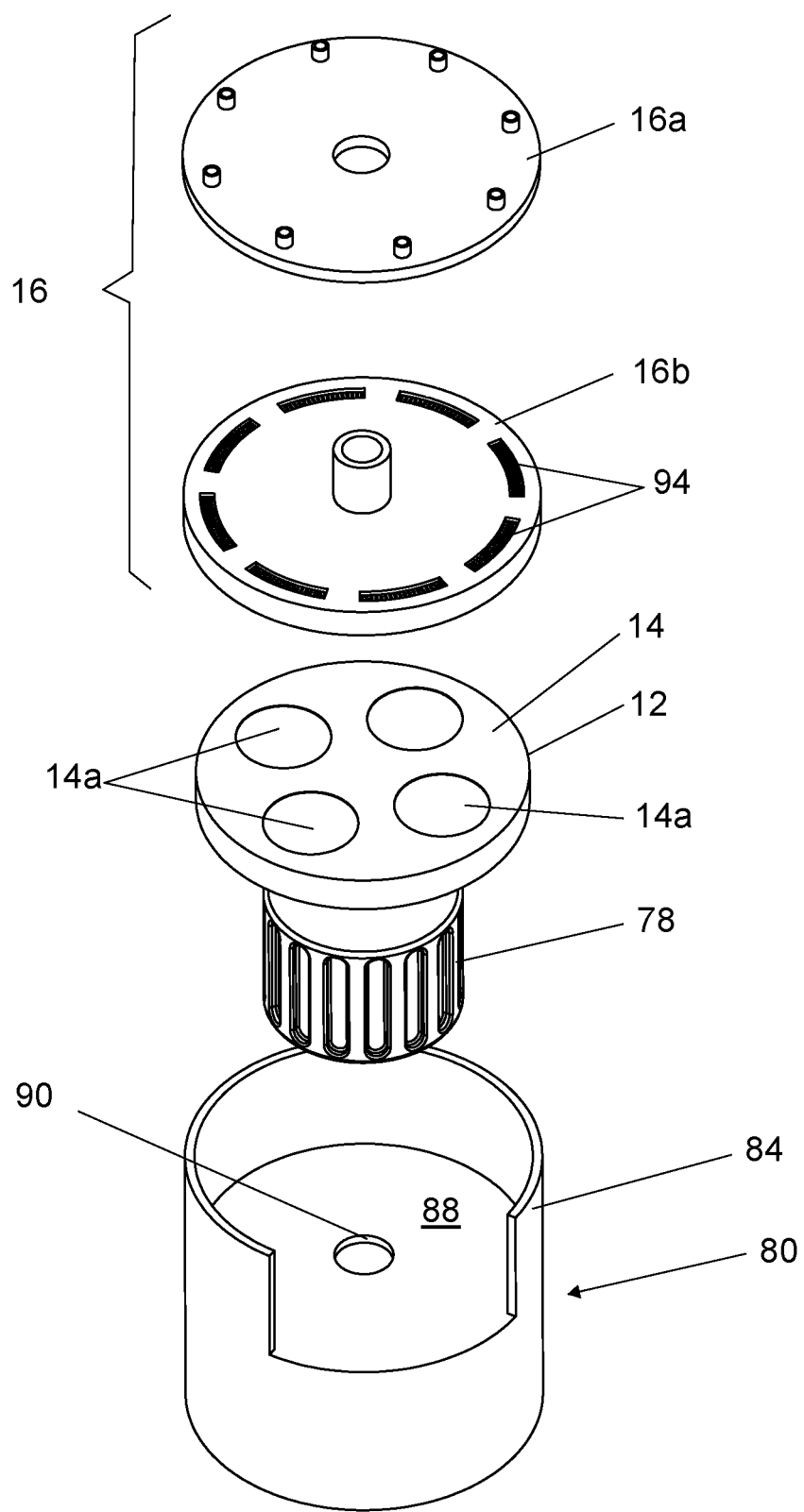
FIG. 14 shows an exploded perspective view slightly from above of a second example of a SALD-apparatus.
Figure 15:
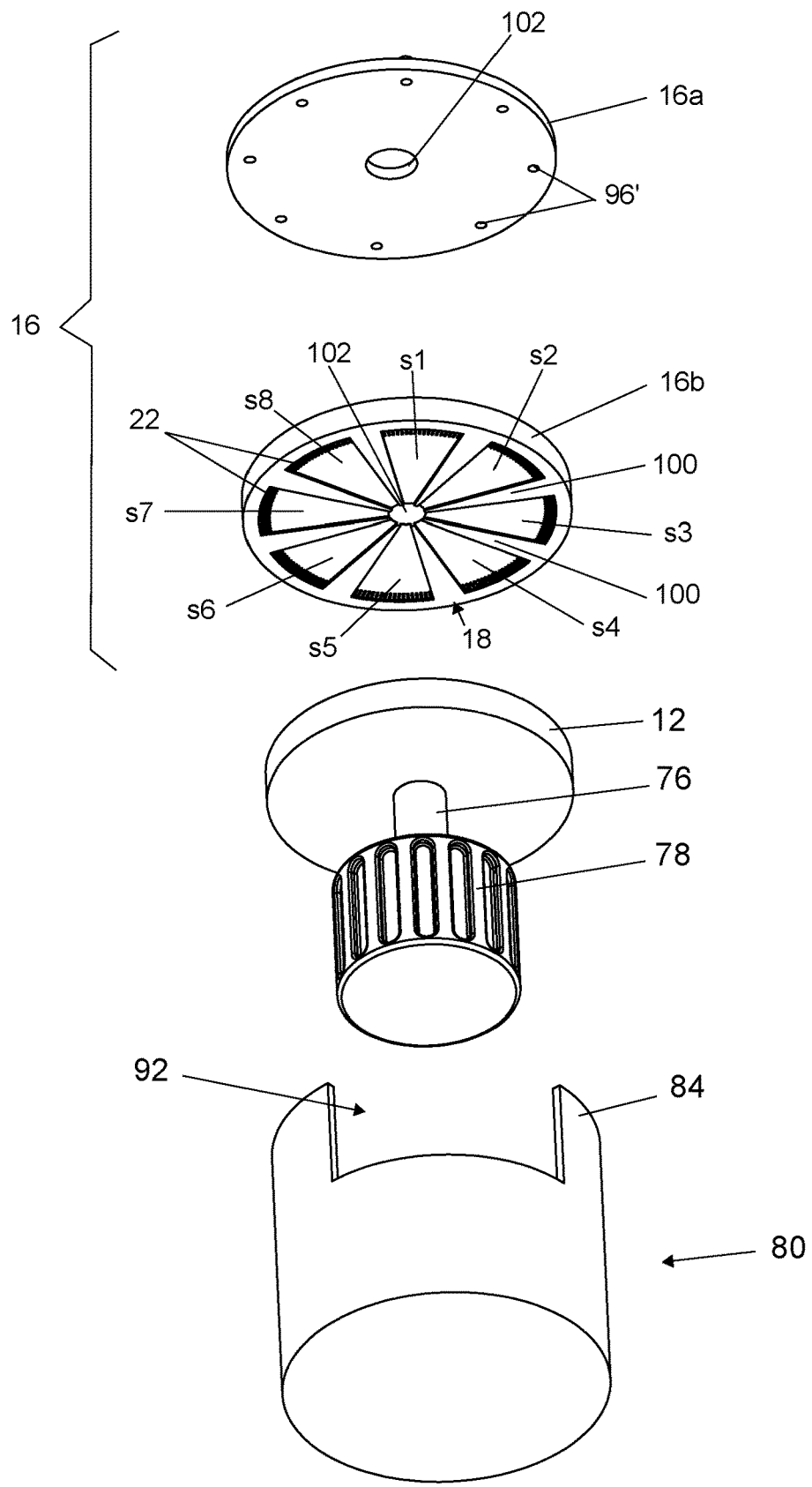
FIG. 15 shows an exploded perspective view slightly from below of the second example.
Figure 16:
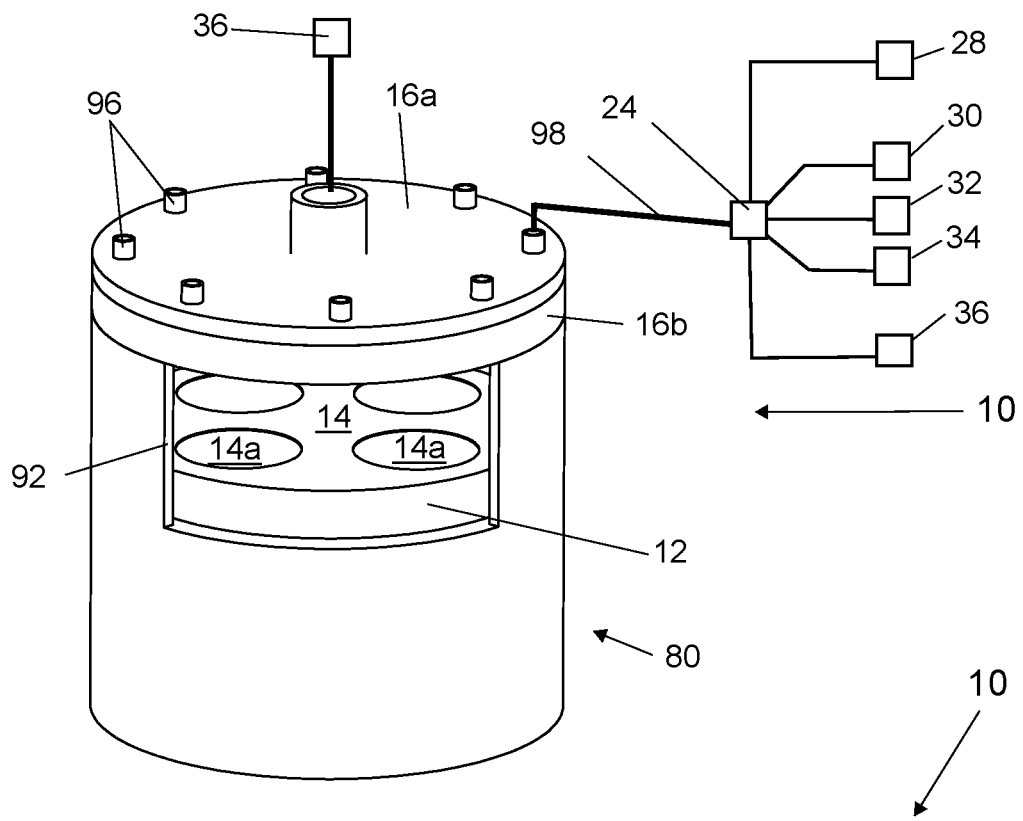
FIG. 16 shows a perspective view slightly from above of the second example.
Figure 17:
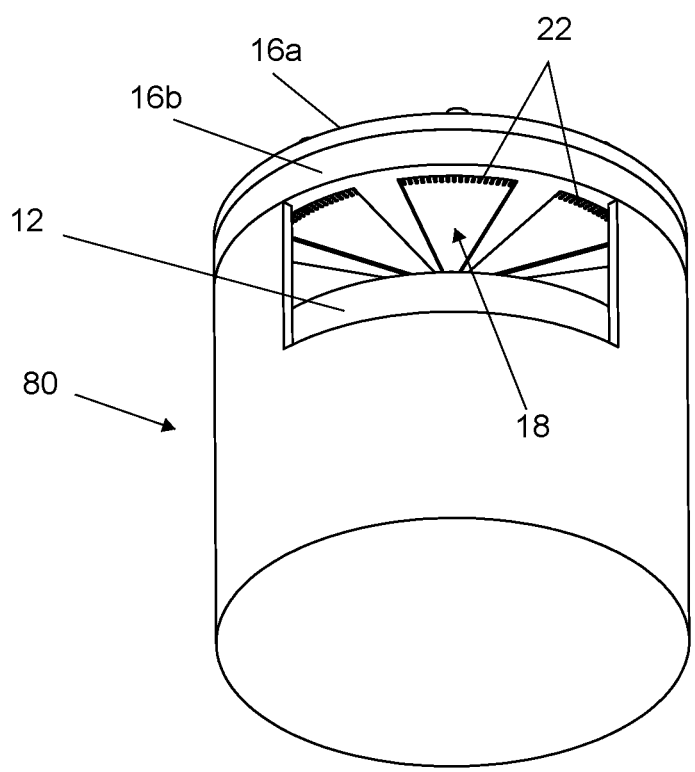
FIG. 17 shows a perspective view slightly from below of the second example.
Figure 18:
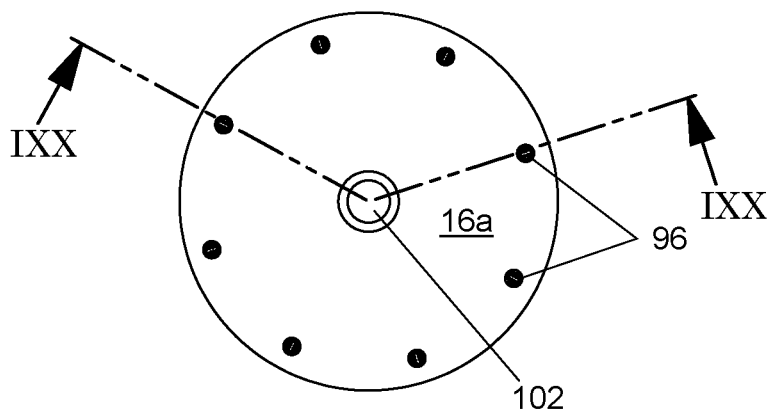
FIG. 18 shows a top view of the second example.
Figure 19:
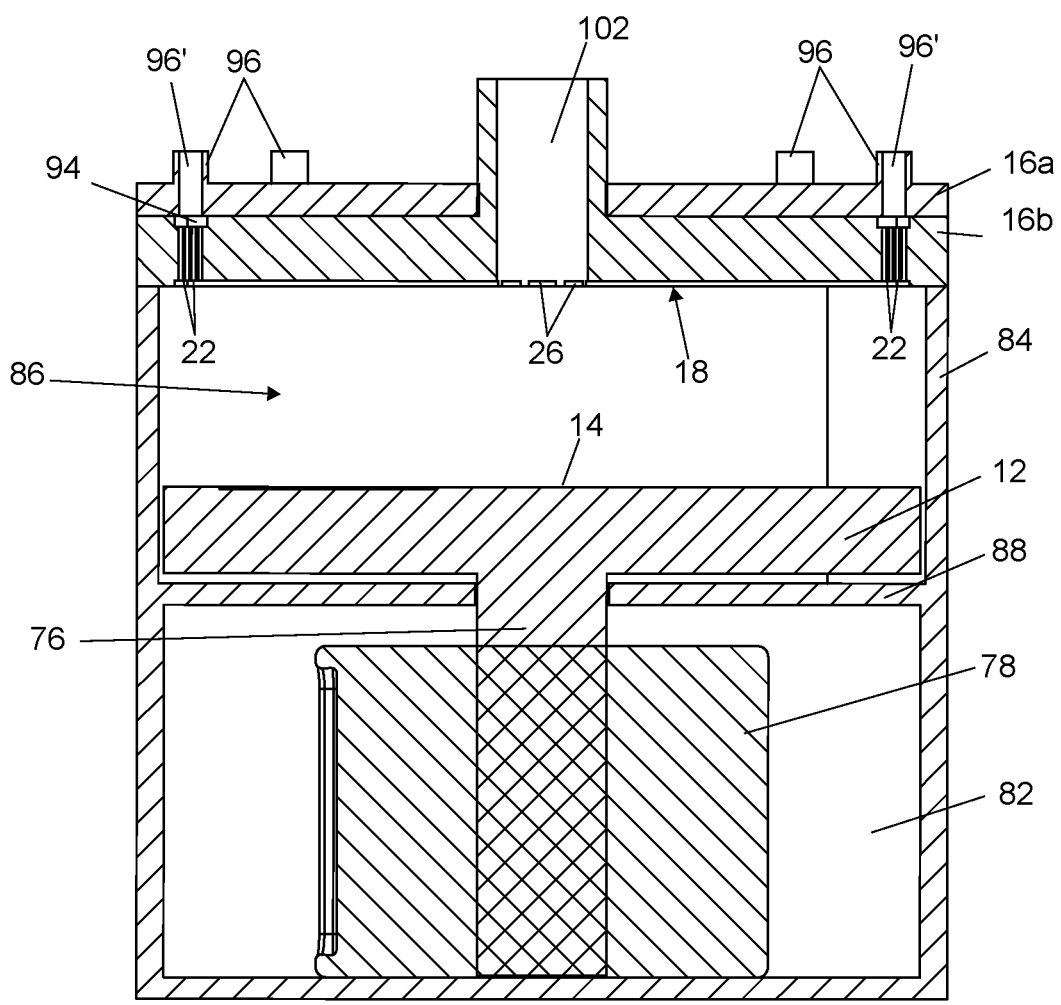
FIG. 19 shows a cross sectional view over line IXX-IXX in FIG. 18 in the opened condition.
Figure 20:
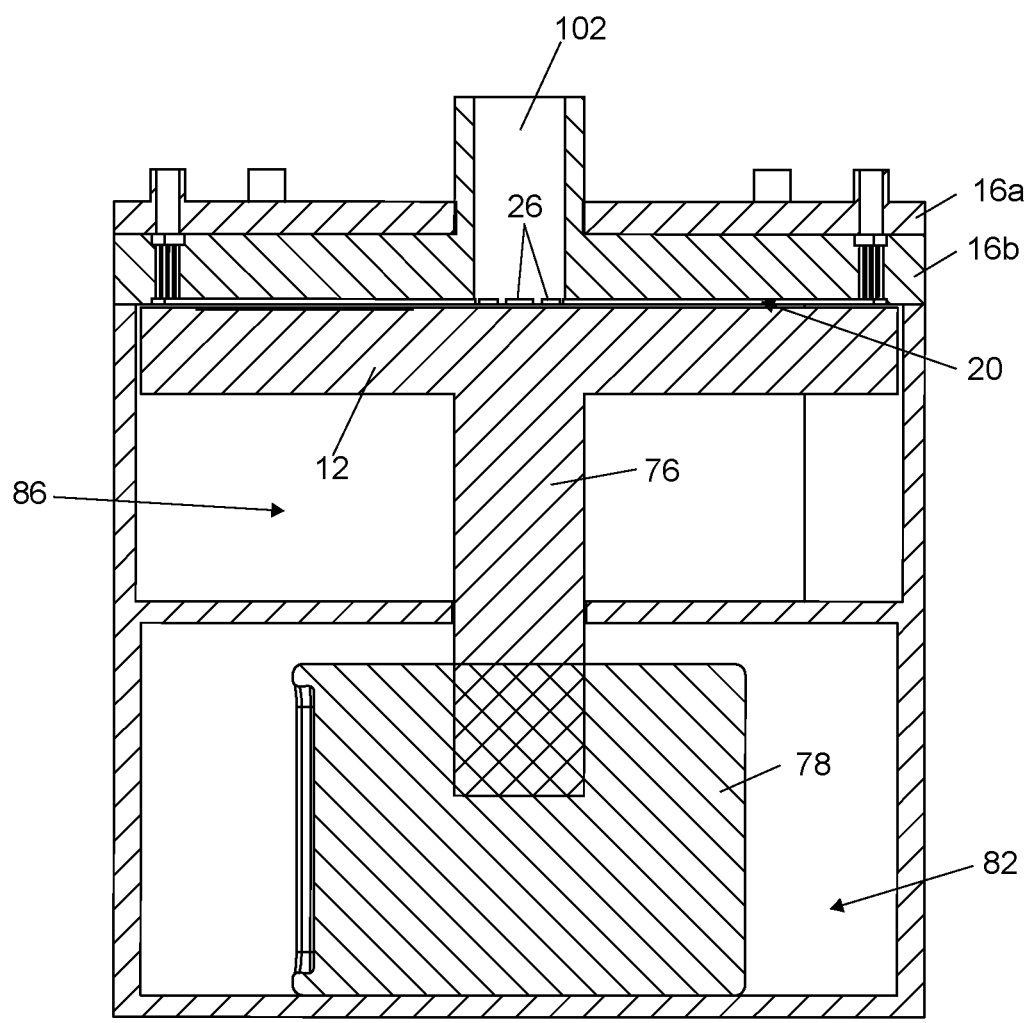
FIG. 20 shows a cross sectional view over line IXX-IXX in FIG. 18 in the closed condition.

FIGS. 14 and 15 clearly show the various parts of the second example of the SALD-apparatus. The showerhead 16 includes a gas supply plate 16*a* and a gas distribution plate 16*b* which are in use fixedly connected to each other. A susceptor 12 is connected to a central shaft 76 which can be rotated by a motor 78. The central shaft 76 can also be moved upwardly and downwardly. This can be effected by the same motor 78. In alternative embodiments a second drive may be present to perform the upward and downward movement of the susceptor 12. For example, the motor 78 may be mounted on an upwardly and downwardly moveable support. In the second example the motor 78 is accommodated in a housing 80, more particularly in a bottom chamber 82 thereof (see FIGS. 19 and 20). A side wall 84 of the housing 80 extends upwardly and the showerhead 16 is fixedly mounted on the upper edge of the side wall 84. The susceptor is accommodated in a top chamber 86 of the housing 80. The top chamber 86 and the bottom chamber 82 are substantially separated from each other by a separation wall 88 with a central opening 90 through which central shaft 76 extends. The side wall 84 includes an opening 92 via which substrates may be moved to and from the susceptor 12. The opening 92 may be provided with a closure, not shown, so that in open the position substrates can be moved in and out of chamber 86 and in closed position chamber 86 is sealed gas-tightly. Moving the substrates may be done manually or, alternatively, automatically with a pick-and-place unit, not shown. When placing substrates on or removing substrates from the susceptor 12, the susceptor 12 will be moved to a downward position so that the SALD-apparatus is in the opened condition. This opened condition is shown in FIGS. 16, 17 and 19. During the ALD-process, the susceptor 12 is moved upwardly so as to leave a small gap 20 between the substrate support surface 14 of the susceptor 12 and the showerhead side 18 of the showerhead 16. This gap 20 is indicated in FIG. 19.

As clearly shown in FIG. 14, the top side of the gas distribution plate 16*b* includes a number of ring segment shaped chambers 94. In this example, the ring segment shaped chambers 94 are positioned at a radially outward position of the gas distribution plate 16*b*. The gas supply plate 16*a* has a number of connection nipples 96 to which respective gas conduits 98 can be connected. One gas conduit 98 is schematically shown in FIG. 16. Each connection nipple 96 includes a gas channel 96' (see FIG. 19) that opens into an associated ring segment shaped chamber 94. In each ring segment shaped chamber 94 section openings 22 are provided which extend through the gas distribution plate 16*b* to the bottom side thereof which is indicated herein as showerhead side 18. As clearly shown in FIG. 15, the showerhead side 18 includes a number of radially extending section shaped chambers which are separated from each other by radially extending ribs 100. Each radially extending section shaped chamber defines a gas section s1-s8 within the gap 20. Each section shaped chamber on the showerhead side 18 opens via a central exhaust opening 26 (see FIGS. 19, 20) into a central exhaust channel 102 in the gas distribution plate 16*b*. The central exhaust channel 102 also extends in the gas supply plate 16*a* so that the showerhead 16 includes a central exhaust channel 102. Alternatively, the central exhaust channel 102 may extend through the susceptor 12 and at least partly through the shaft 76.

In use of the second example, gas may be supplied via the gas channels 96' of the connection nipples 96 to the ring segment shaped chambers 94. In these ring segment shaped chambers 94 the gas may be evenly distributed so that every section opening 22 connected with that ring segment shaped chamber 94 will be supplied with substantially the same amount of gas. The gas leaves the section openings 22 and arrives in the gap 20 between the showerhead side 18 and the substrate support surface 14 of the susceptor 12. The central exhaust channel 102 of the showerhead 16 is connected to an exhaust 36, e.g. a vacuum source. Consequently, the gas will flow radially inwardly within each section s1-s8 within the gap 20. It will flow along the path with smallest flow resistance and thus only a very small amount may pass one of the radially extending ribs 100 which have a smaller spacing to the susceptor 12 than the regions in between the ribs 100. The major part will remain in the radially extending section chambers that define the radially extending sections s1-s8 within the gap 20 and flows from the radial outward region to the central exhaust channel 102. Some of the connection nipples 96 may also be connected to an exhaust 36.

As is clearly shown in FIG. 16, the gas conduit 98 includes a multi-way valve assembly 24 via which the gas conduit 98 may be selectively connected to various gas sources 28-34 for supplying different types of gas. Alternatively, the multi-way valve assembly 24 may also connect the gas conduit 98 to an exhaust 36. By switching the multi-way valve assembly 24, the associated switchable showerhead section s1-s8 may be supplied with the desired gas or may, in an embodiment, be converted into an exhaust section. Thus various zones Z of gas may be created within the gap 20. The sequence and the length of the various gas zones Z may be varied simply by switching the various multi-way valve assemblies 24.

Figure 21:
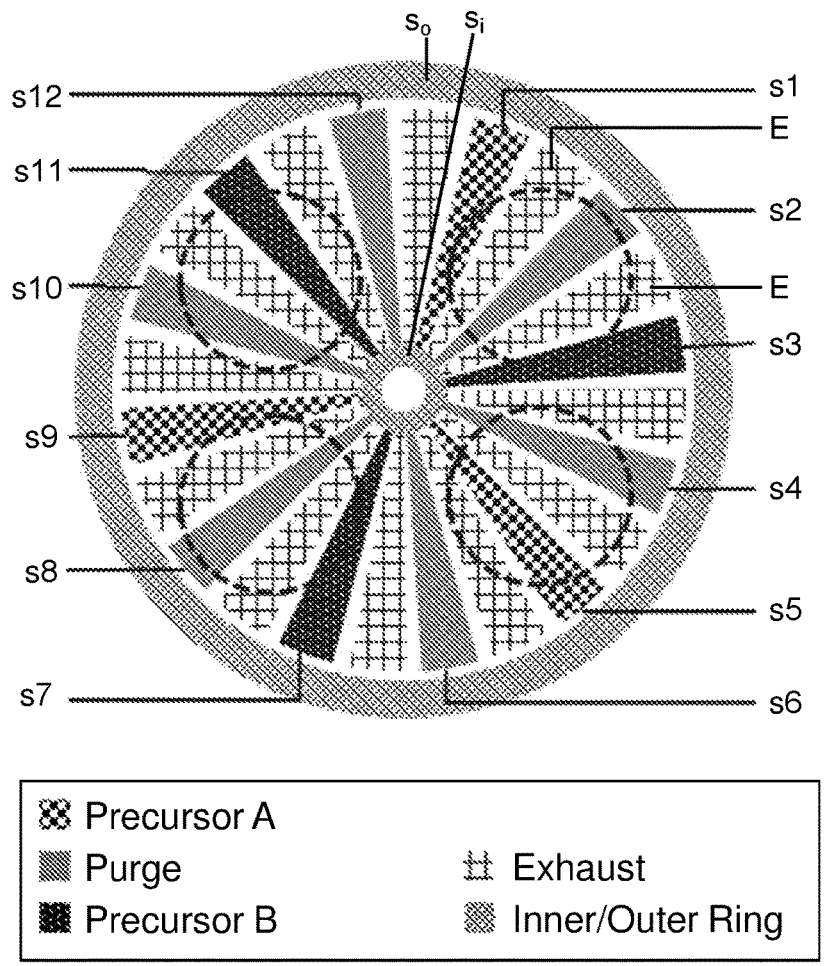
FIG. 21 shows a schematic view of a first example of a showerhead, having pie shaped switchable sections for vertical down flow that are all equal in size and that are separated by exhaust switchable sections.
Figure 23:
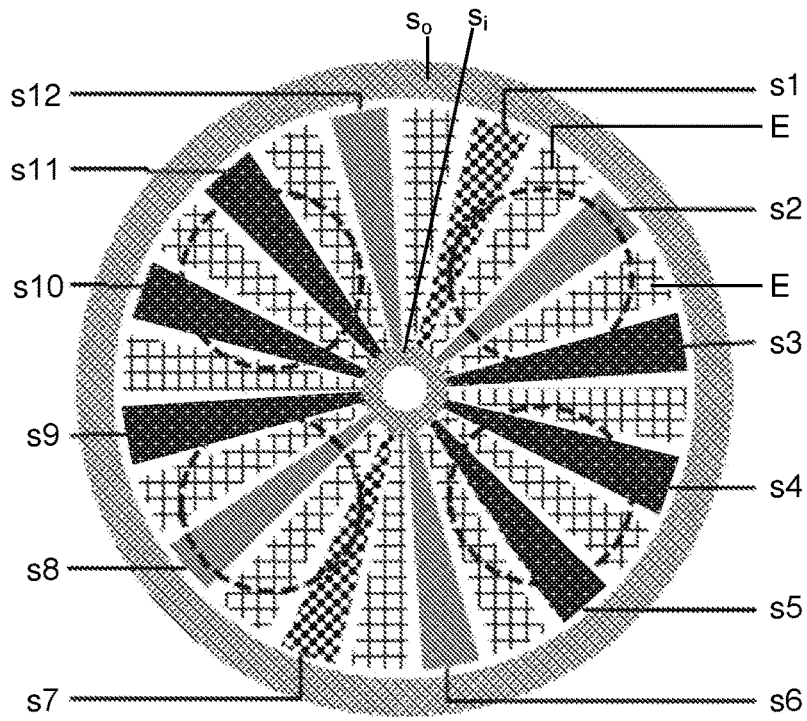
FIG. 23 shows a schematic view of a second example of a showerhead, having pie shaped switchable sections for vertical down flow that are all equal in size and that are separated by exhaust switchable sections.
Figure 25:
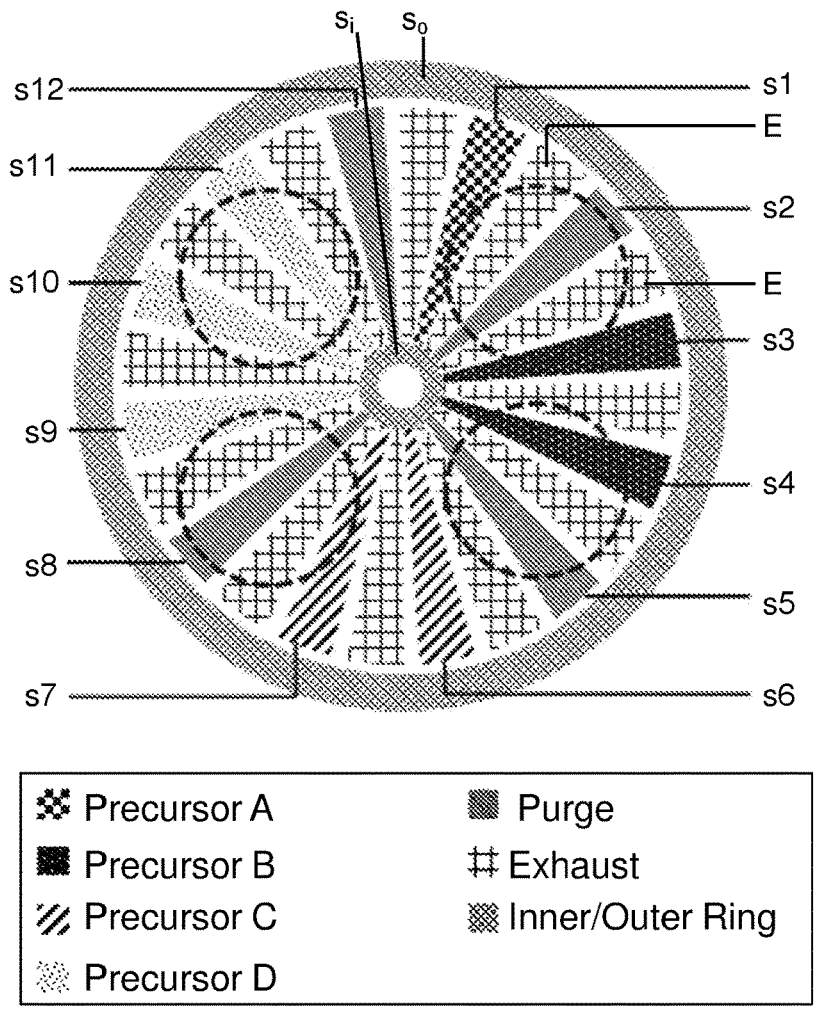
FIG. 25 shows a schematic view of a third example of a showerhead, having pie shaped switchable sections for vertical down flow that are all equal in size and that are separated by exhaust switchable sections.

Now turning to the examples shown in FIGS. 21, 23, 25. These examples are based on the first example shown in FIGS. 1-13, be it that the number of switchable showerhead sections s1-s12 is twelve instead of eight. In these figures the showerhead side 18, which is normally directed downwardly, is schematically shown. The striped circles represent the position of substrates W to be treated and which are positioned on the susceptor 12. The showerhead 16 includes twelve switchable showerhead sections s1-s12 which are each separated by an exhaust section E. Also depicted are an outer ring section $s_o$ and an inner ring section $S_i$. The hatching shows the type of gas that is supplied to each section s1-s12.

In the example shown in FIG. 21, sections s1, s5, s9 are supplied with precursor gas A. Sections s3, s7 and s11 are supplied with precursor gas B. Sections s2, s4, s6, s8, s10 and s12 are supplied with purge gas so as to create a good gas separation between precursor gasses A and B. The outer ring section $s_o$ and an inner ring section $s_i$ are supplied with purge gas. Alternatively, the outer ring section $s_o$ and an inner ring section $s_i$ may be connected to an exhaust 36.

Figure 22:
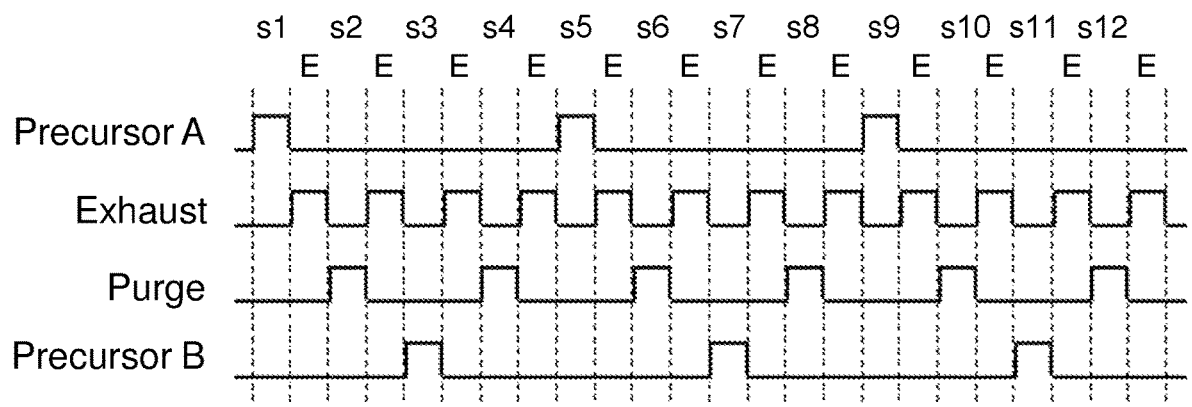
FIG. 22 shows the sequential passage of a substrate through respective switchable sections of the showerhead as the susceptor is rotating relative to the showerhead of FIG. 21.

FIG. 22 shows the sequential passage of a substrate through respective switchable showerhead sections of the showerhead as the susceptor is rotating relative to the showerhead of FIG. 21. FIG. 22 clearly shows to which type of gas or exhaust parts of the substrate are sequentially exposed. In this example the sequential exposure of each part of the substrate will be precursor gas A, exhaust E, purge gas, exhaust E, precursor gas B, exhaust E, purge gas, exhaust E and then the same sequence of exposure will be repeated. It will be understood that different parts of the substrate will sequentially be exposed to the same sequence of gases but the sequence may be shifted in time so that at one moment different parts of the substrate may be exposed to different gases.

In the example shown in FIG. 23, sections s1 and s7 are supplied with precursor gas A. Sections s3, s4, s5, s9, s10, s11 are supplied with precursor gas B. Sections s2, s6, s8 and s12 are supplied with purge gas so as to create a good gas separation between the precursor gasses A and B. Again, the outer ring section $s_o$ and an inner ring section $s_i$ are supplied with purge gas. In this example, two relatively large zones are created which are each formed by three subsequent sections. Sections s3, s4, s5 for the first large zone and sections s9, s10, s11 for the second large zone in which precursor gas B is supplied. Between these two large zones two small zones extend which are each formed by a single section and in which precursor gas A is supplied. The zones are separated by purge gas zones which all have the size of one section, i.e. section s2, s6, s8 and s12.

Figure 24:
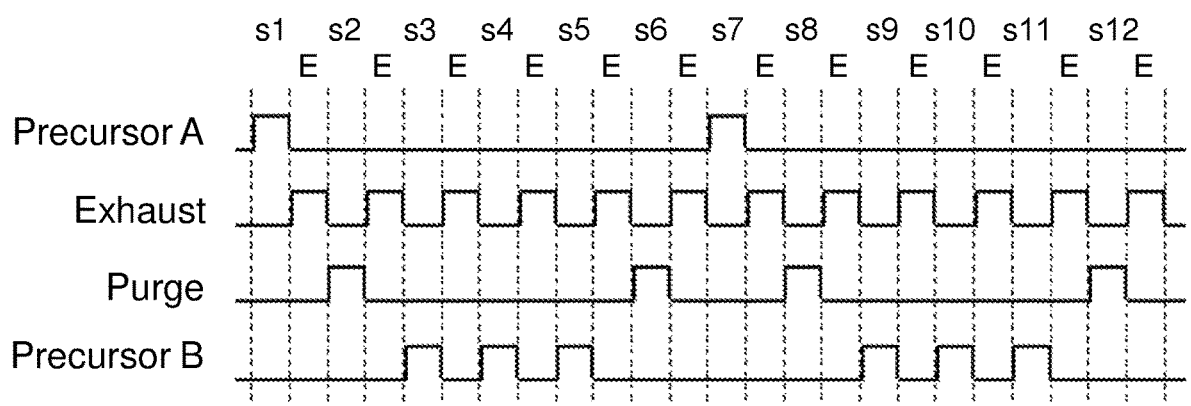
FIG. 24 shows the sequential passage of a substrate through respective switchable sections of the showerhead as the susceptor is rotating relative to the showerhead of FIG. 23.

FIG. 24 shows the sequential passage of a substrate through respective switchable showerhead sections of the showerhead as the susceptor is rotating relative to the showerhead of FIG. 23. FIG. 24 clearly shows to which type of gas or exhaust parts of the substrate are sequentially exposed. In this example the sequential exposure of a part of the substrate will be precursor gas A, exhaust E, purge gas, exhaust E, precursor gas B, exhaust E, precursor gas B, exhaust E, precursor gas, exhaust E, purge gas, exhaust E and then the same sequence of exposure again.

In the example shown in FIG. 25, section s1 is supplied with precursor gas A to form a first zone. Sections s3, s4 are supplied with precursor gas B to form a second zone. Sections s6 and s7 are supplied with precursor gas C to form a third zone and, finally, sections s9, s10 and s11 are supplied with precursor gas D to form a fourth zone.

Figure 26:
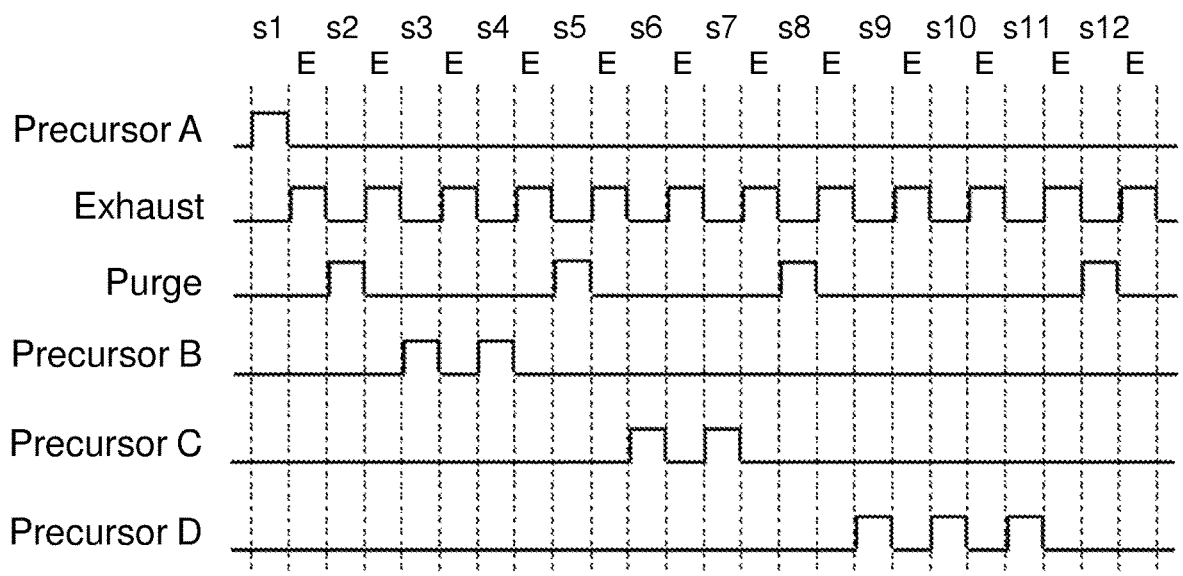
FIG. 26 shows the sequential passage of a substrate through respective switchable sections of the showerhead as the susceptor is rotating relative to the showerhead of FIG. 25.

FIG. 26 shows the sequential passage of a substrate through respective switchable showerhead sections of the showerhead as the susceptor is rotating relative to the showerhead of FIG. 25. FIG. 26 clearly shows to which type of gas or exhaust parts of the substrate are sequentially exposed. In this example the sequential exposure of a part of the substrate will be precursor gas A, purge gas, precursor gas B, precursor gas B, purge gas, precursor gas C, precursor gas C, purge gas, precursor gas D, precursor gas D, precursor gas D. Between each exposure to precursor gas and/or purge gas a said part of the substrate passes an exhaust section E.

Figure 27:
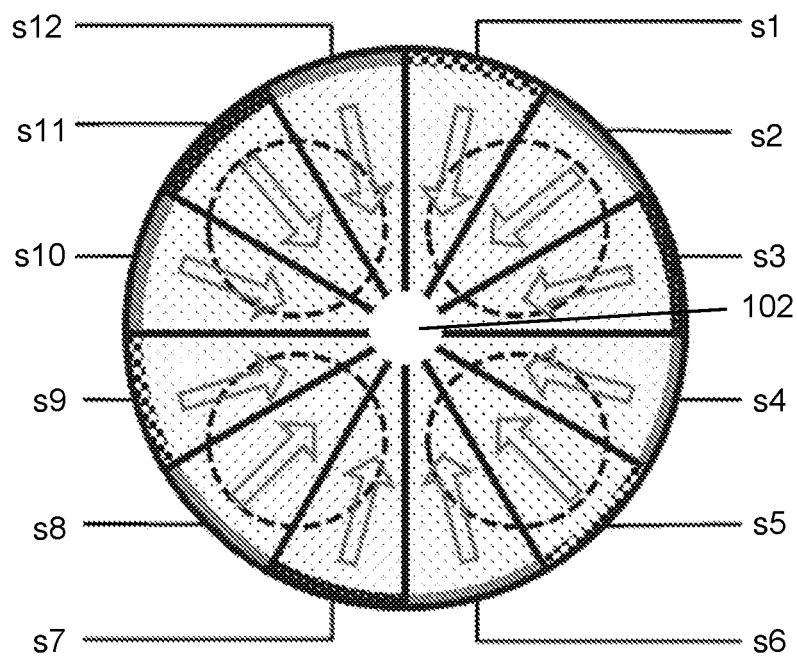
FIG. 27 shows a schematic view of a fourth example of a showerhead, having equally sized pie shaped switchable sections with a radial gas flow configuration.
Figure 27:
Figure 28:
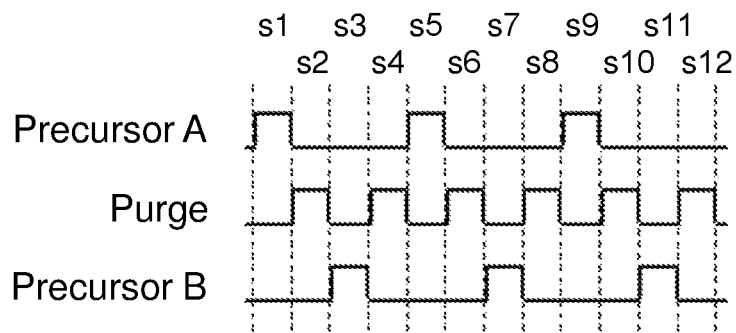
FIG. 28 shows the sequential passage of a substrate through respective switchable sections of the showerhead as the susceptor is rotating relative to the showerhead of FIG. 27.
Figure 29:
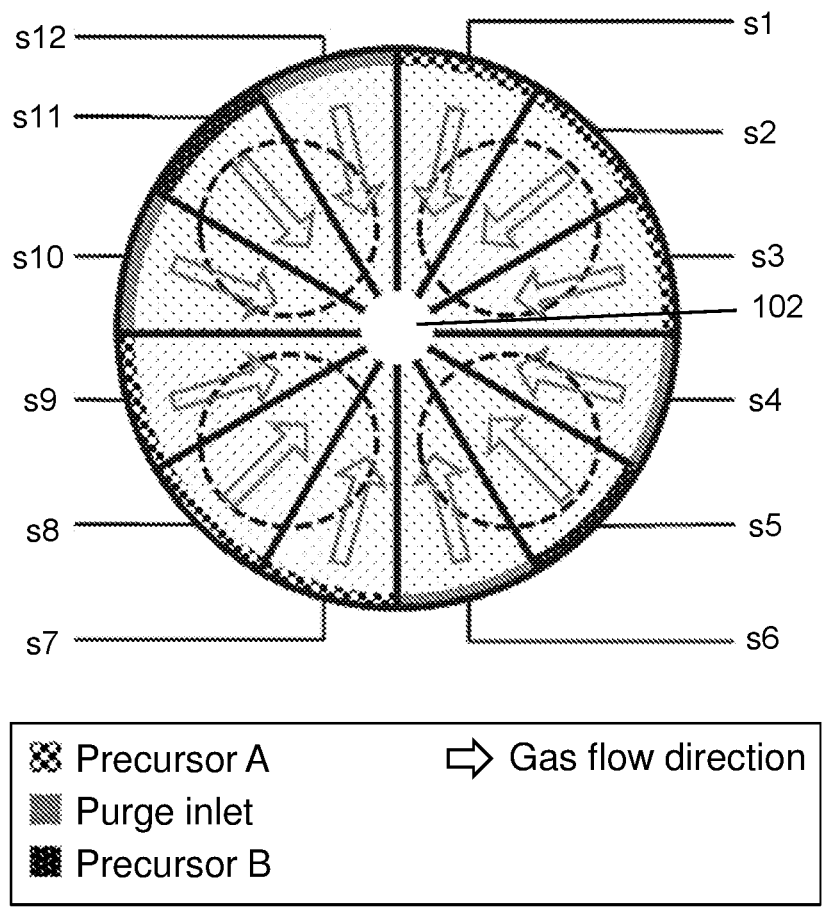
FIG. 29 shows a schematic view of a fifth example of a showerhead, having equally sized pie shaped switchable sections with a radial gas flow configuration.
Figure 30:
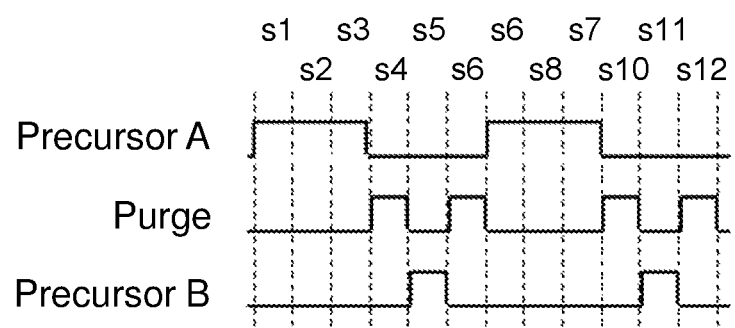
FIG. 30 shows the sequential passage of a substrate through respective switchable sections of the showerhead as the susceptor is rotating relative to the showerhead of FIG. 29.
Figure 31:
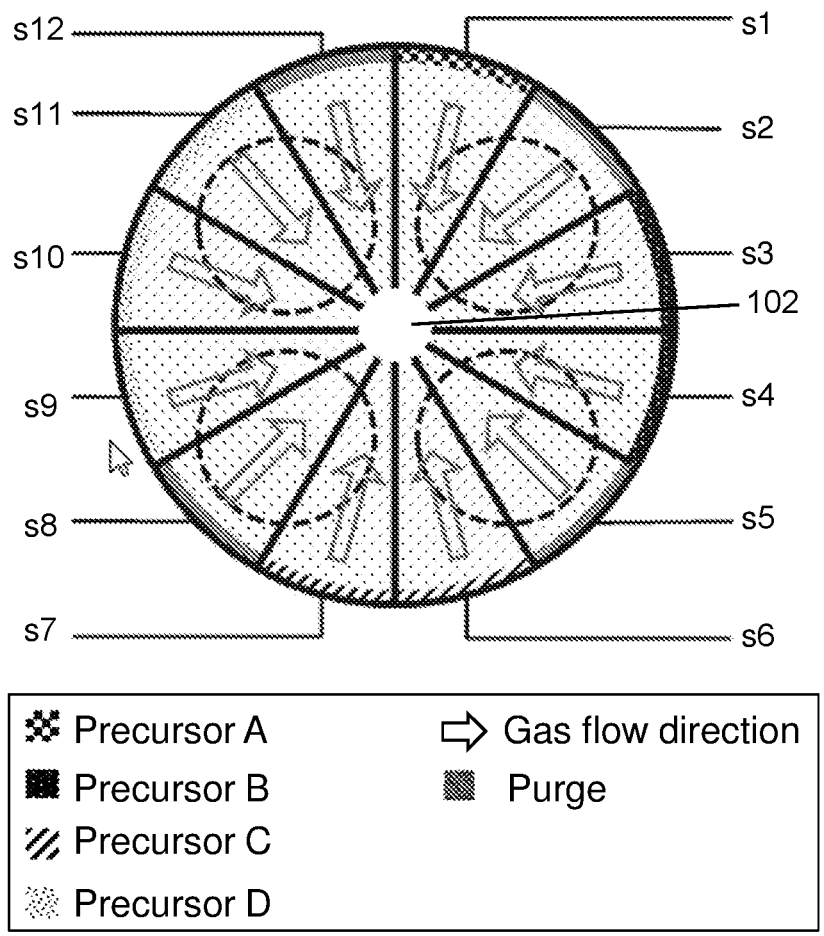
FIG. 31 shows a schematic view of a sixth example of a showerhead, having equally sized pie shaped gas injection switchable sections with a radial gas flow configuration.
Figure 32:
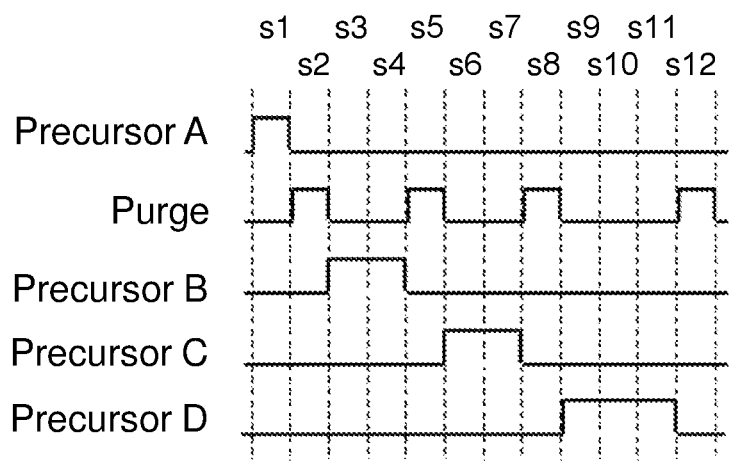
FIG. 32 shows the sequential passage of a substrate through respective switchable sections of the showerhead as the susceptor is rotating relative to the showerhead of FIG. 31.

The examples shown in FIGS. 27, 29, 31 are based on the second example shown in FIGS. 14-20, be it that the number of switchable showerhead gas sections s1-s12 is twelve instead of eight. In the examples of FIGS. 27, 29, 31 a radial inwardly directed flow prevails within the gas sections s1-s12. The gas is supplied in the outer circumferential ring area of the gap 20 as explained with reference to the second example of FIGS. 14-20. In FIGS. 27, 29, 31 it is clearly visible that the hatching of the ring area varies from section to section and indicates which type of gas is supplied in a certain section. Again, the striped circles represent the position of the substrates to be treated relative to the showerhead 16. The central exhaust channel 102 is also clearly shown in the figures.

In the example of FIG. 27 gas sections s1, s5 and s9 are supplied with precursor gas A so as to form three zones in which precursor gas A is supplied. Gas sections s3, s7, and s11 are supplied with precursor gas B so as to create three zones in which precursor gas B is supplied. The precursor gas zones A and B are each separated by purge gas zones which are formed by gas sections s2, s4, s6, s8, s10 and s12. As will be readily apparent from FIG. 28, parts of a substrate will subsequently be exposed to precursor gas A, purge gas, precursor gas B, purge gas and then the same sequence of exposure again.

In the example of FIG. 29, a first zone of precursor gas A is created by sections s1, s2 and s3. A second zone of precursor gas A is created by sections s7, s8 and s9. In between these two zones are two zones of precursor gas B which are formed by gas sections s5 and s11. The respective precursor gas zones are separated by purge gas zones which are formed by sections s4, s6, s10 and s12. As is clear from FIG. 30, parts of a substrate will subsequently be exposed to a large zone of precursor gas A, a small purge gas zone, a small zone of precursor gas B, a purge gas zone and then the same sequence of exposure again.

In the example of FIG. 31, a small first zone of precursor gas A is created by section s1. Section s2 creates a purge gas zone. Sections s3 and s4 create a zone of precursor gas B. Section s5 creates a purge gas zone. Sections s6 and s7 create a zone of a precursor gas C. Section s8 creates a purge gas zone. Sections s9, s10 and s11 create a zone of precursor gas D and, finally, section s12 creates a purge gas zone. As will be readily apparent from FIG. 32, parts of a substrate will sequentially be exposed to a small zone of precursor gas A, purge gas, a larger zone of precursor gas B, purge gas, a larger zone of precursor gas C, purge gas, a large zone of precursor gas D and finally purge gas.

All these variations and many more can be easily obtained by switching the various multi-way valve assemblies 24 with which each switchable showerhead section s1-s12 is fluidly connected.

In the following, various embodiments will be described which are also subject of a dependent claim.

In an embodiment, of which an example is shown in FIG. 9 and FIG. 16, each multi-way valve assembly 24 is switchable to fluidly connect the respective gas channel 64, 68; 96' that is fluidly connected to the respective multi-way valve assembly 24 with a gas exhaust 36. Thus, a switchable showerhead section can not only have the function of supply of precursor or purge gas but may also be used as an exhaust zone. Intermediate exhaust zones E may be beneficial to obtain an improved separation of the various types of precursor gasses A, B, C, D. In the examples of FIGS. 21, 23 and 25 the exhaust zones E are fixed and not switchable to be supplied with different types of gasses. This means that the gas zone formed by section s3, s4 and s5, which all inject the same precursor gas B is interrupted by exhaust zones E. Although this takes space, it reduces the concentration of reaction by-products in the gas zone which may have a positive effect on the completion of the chemical reactions. However, if these exhaust zones E were switchable as well, the precursor zones A, B and optionally C and D that may be created would not have to be interrupted by exhaust zones E. This would improve the efficiency of the showerhead 16 because within a zone of a certain type of gas, the gas would not have to be exhausted within that zone. Consequently, the gas consumption would be less in such a system.

In an embodiment, of which the first example shown in FIGS. 1-13 is an example and of which the showerheads shown in FIGS. 21, 23 and 25 are examples, the at least one showerhead opening 22 of a said showerhead section s1-s12 comprises a plurality of showerhead openings 22 that are distributed over a surface area of the showerhead side 18 that corresponds with a section area that radially extends from a central region of the showerhead side 18 to a circumferential region of the showerhead side 18. This has the effect that, in use, substantially the whole section area of the switchable showerhead section s1-s12 is supplied with gas from the gas source to which the plurality of section openings 22 of that respective switchable showerhead section s1-s12 are fluidly connected via the associated multi-way valve assembly 24. Thus a downwardly directed flow over the entire section area of the gap 20 may be created that is supplied with gas by a said switchable showerhead section s1-s12.

In an alternative embodiment, of which no example is shown in the figures, the at least one showerhead opening 22 of a said showerhead section opens into a central region of the showerhead side 18. In that embodiment, each showerhead section s1-s12 comprises at least one exhaust opening that opens into the circumferential region of the showerhead side 18 such that in use, a radially outwardly directed gas flow within the gap 20 is associated with each showerhead section s1-s12.

A radial outward flow may provide a good coverage of the substrate area.

In yet another alternative embodiment, of which the second example of FIGS. 14-20 is an example and of which the showerheads shown in FIGS. 27, 29 and 31 are also examples, the at least one showerhead opening 22 of a said section s1-s12 opens into the circumferential region of the showerhead side 18, wherein each section s1-s12 comprises at least one exhaust opening 26 that opens into the central region of the showerhead side 18, such that in use, a radially inwardly directed gas flow within the gap 20 is associated with each showerhead section s1-s12.

A radial inward flow of gas may even provide an even better coverage of the substrate area.

In an embodiment having a radially inwardly directed flow of gas within the switchable showerhead sections, of which examples are shown in FIGS. 14-20 and 27, 29, 31, a central exhaust channel 102 may be provided that extends along the axis of rotation A in at least one of the showerhead 16 and the susceptor 12 which central exhaust channel 102 opens with one end in said gap 20 and is connected with another end to an exhaust 36. In such an embodiment, the at least one central exhaust opening 26 of each section s1-s12 may be formed by the radially inner side of a gap section that is in direct communication with the central exhaust channel 102.

Such an embodiment has the advantage that it is relatively simple of construction because all the precursor gasses and the purge gas is exhausted centrally. This has the beneficial effect that intermediate exhaust zones may be refrained from because sufficient separation of the precursor gasses may be obtained by simply separating the precursor zones with purge gas zones. Within the gap 20 the used precursor gasses will be exhausted centrally.

In an embodiment, of which no example is shown, the showerhead 16 may include a circumferential wall that substantially closes off a radial outward boundary of the gap 20. Optionally, the at least one showerhead opening 22 of a said showerhead section s1-s12 may be accommodated in the circumferential wall. Especially in a variant in which the gas flow within the gap 20 is radially inwardly, such a configuration may be beneficial from a constructional point of view.

In an embodiment, of which the first example shown in FIGS. 1-13 is an example, the showerhead 16 may be mounted rotatably around the central axis A for effecting the relative rotation between the showerhead 16 and the susceptor 12 during processing substrates.

Such a construction is relatively complicated in view of the supply of gas to the showerhead 16. However, an advantage is that the substrates are stationary while being processed and not subjected to centrifugal forces resulting from rotation of the susceptor.

In an alternative embodiment, of which the second example shown in FIGS. 14-20 is an example, the susceptor 12 may be mounted rotatably around the central axis A for effecting the relative rotation between the showerhead 16 and the susceptor 12 during processing substrates and wherein the showerhead 10 is non-rotatably mounted.

Such an embodiment may have a somewhat simpler construction. However, rotating the substrates during processing may not be desirable.

The choice between these two latest embodiments may be dependent on the type of substrate that has to be processed.

In use, zones are created in the gap 20 by switching the multi-way valve assemblies 24 of the respective showerhead sections s1-s12 in a desired position so as to connect each switchable showerhead section s1-s12 with a desired gas source 28-34 or an exhaust 36. Each zone, when viewed in a tangential direction around the central axis A, includes one or a number of successive switchable showerhead sections s1-s12.

This switchability of the sections provides a very high flexibility with respect to the gas types that may be supplied and the exposure times that may be created with the same SALD-apparatus, so that in one SALD-apparatus, multiple ALD-processes with different precursors and chemistries can be carried out while optimizing the exposure time for each precursor by selecting for each precursor an optimum combination of section width and speed of rotation of the susceptor relative to the showerhead.

In an embodiment, of which an example is shown in FIG. 21, in the gap 20 a plurality of different zones may be present that may subsequently include, when viewed in a tangential direction around the central axis A, a first precursor gas zone, a gas exhaust zone, a purge gas zone, a gas exhaust zone, a second precursor gas zone, a gas exhaust zone, a purge gas zone and a gas exhaust zone.

Such a configuration may suffice for a simple SALD-deposition process.

In an embodiment, of which an example is shown in FIGS. 9 and 16, the multi-way valve 24 of each of the switchable showerhead sections s1-s12 has at least a main connection and may have at least three branch connections. The main connection is connected to a gas conduit 98 which is fluidly connected to one gas channel 64, 68 or 96' of the plurality of gas channels of the showerhead 16. The three branch connections may be fluidly connected to respectively a first precursor gas source 28, a second precursor gas source 30, and a purge gas source 34.

In an elaboration of the previous embodiment, each multi-way valve 24 may have at least one additional branch connection. The fourth branch connection may be fluidly connected a gas exhaust 36.

In yet a further elaboration, each multi-way valve 24 may have at least two additional, fifth and sixth branch connections. The fifth branch connection may be fluidly connected to a third precursor gas source 34. The sixth branch connection may be fluidly connected to a fourth precursor gas source D.

In an embodiment, of which examples are shown in FIGS. 21, 23 and 25, the showerhead side 18 may include a second plurality of section openings which are permanently connected to a single gas source 28-34 or to an exhaust 36 so as to define non-switchable showerhead sections that extend substantially radially from the central area to the circumferential area. Each non-switchable showerhead section may be positioned between two switchable showerhead sections s1-s12 that are each associated with a said multi-way valve assembly 24. In the examples shown in FIGS. 21, 23 and 25, the sections designated with E are non-switchable showerhead exhaust sections.

In an embodiment, of which first and second example shown in FIGS. 1-20 are examples, the at least one of the showerhead 16 and the susceptor 12 is upwardly and downwardly moveable, such that height of the gap 20 is adjustable. Thus the gap 20 between the susceptor 12 and the showerhead 16 may be increased for example for removing substrates from or placing substrates on the susceptor 12.

In yet another embodiment, of which the first example shown in FIGS. 1-13 and the examples of FIGS. 21, 23 and 25 are an example, radially outwardly of the showerhead openings 22 the showerhead may be provided with outer ring openings 40 that define an outer ring section $s_o$ extending along the entire circumference of the showerhead 16 in the showerhead side 18 adjacent the radial outer edge of the showerhead side 18. The outer ring openings 40 may be fluidly connected to an exhaust 36 and/or a purge gas source 34. Such an outer ring section $s_o$ prevents that potentially hazardous precursor gasses leak to the environment.

In yet another embodiment, not shown, the showerhead may be provided with first outer ring openings and second outer ring openings, defining respectively a first outer ring section and a second outer ring section extending along an entire circumference of the showerhead, in the showerhead side adjacent to the outer edge of the showerhead side. One outer ring section may be positioned adjacent and radially outwardly relatively to the other ring section and one outer ring section may be fluidly connected to an exhaust and the other to a purge gas source.

In yet another embodiment, of which the first example shown in FIGS. 1-13 and the examples of FIGS. 21, 23 and 25 are an example, radially inwardly of the section openings 22 the showerhead 16 may provided with inner ring openings 42 that define an inner ring section $s_i$ extending along the entire circumference of the showerhead 16 in the showerhead side 18 adjacent the radial inner edge of the showerhead side 18. The inner ring openings 42 may be fluidly connected to either an exhaust 36 or a purge gas source 34. Thus also radially inwardly leakage of potentially hazardous precursor gasses is prevented. Again, alternativily also two sets of inner ring openings may be provided that define two inner ring sections that extend over the entire circumference of the showerhead side 18 along the adjacent the inner edge of the showerhead side 18. A first inner ring section may be connected to an exhaust 36 and a second inner ring section may be connected to a purge gas source 34.

It will be appreciated that the invention may be practiced otherwise than as described. The descriptions above are intended to be illustrative, not limiting. Thus, it will be apparent to one skilled in the art that modifications may be made to the invention as described in the foregoing without departing from the scope of the claims set out below. Various embodiments may be applied in combination or may be applied independently from one another. Reference numbers used in the above detailed description are not intended to limit the description of the embodiments to the examples shown in the figures. The figures just represent examples and the embodiments may be embodied in other ways than the specific way shown in the examples of the drawings.

LEGEND 10 spatial atomic deposition apparatus
12. susceptor
14. substrate support surface
16. showerhead
16a. gas supply plate
16b. gas distribution plate
18. showerhead side
20. gap
22. section opening
24. multi-way valve assembly
26. central exhaust openings
28. gas source
30. gas source
32. gas source
33. gas source 34. gas source
36. gas exhaust
40. outer ring openings
42. inner ring openings
44. shaft
46. axial channels in shaft
48. annular grooves on shaft
50. transversal channels in shaft
52. openings on a small radius
54. ring-shaped chamber in gas distribution plate with small radius
56. openings on a large radius
58. ring-shaped chamber in gas distribution plate with large radius
60. radially channel with the gas distribution plate
62. openings in gas supply plate associated with sections
64. gas channels extending axially within a hub of the gas supply plate
66. hub of gas supply plate
68. transversal gas channel in the hub
70. section chamber on the top side of the gas distribution plate
72. radial ribs on the top side of the gas distribution plate
74. central opening of the gas supply plate extending through the hub
76. central shaft
78. motor
80. housing
82. bottom chamber of the housing
84. side wall
86. top chamber of the housing
88. separation wall of the housing
90. central opening in the separation wall
92. opening in the side wall
94. ring segment shaped chamber
96. connection nipples
96' gas channel in connection nipple
98. gas conduit
100. radially extending ribs 100
102. central exhaust channel extending in showerhead 16.
s1-s12 switchable showerhead sections
$s_i$. inner ring section
$s_o$. outer ring section
A. axis of rotation

The invention claimed is:

1. A Spatial Atomic Layer Deposition (SALD) apparatus, wherein the SALD apparatus includes:
a susceptor having a substrate support surface on which substrates can be placed; and
a showerhead having a showerhead side that extends substantially parallel to the substrate support surface to form a gap between the substrate support surface and the showerhead side;
wherein the susceptor and the showerhead are rotatable relative to each other around a central axis of rotation (A) that intersects a center of the showerhead and that extends substantially perpendicularly to the substrate support surface;
wherein the showerhead includes a plurality gas channels, wherein each gas channel is fluidly connected with at least one showerhead section opening in the showerhead that opens into the gap for at least one of supplying gas into and exhausting gas from the gap, wherein each gas channel with the at least one showerhead section opening to which it is fluidly connected defines a showerhead section so that the showerhead includes a plurality of showerhead sections;
wherein the SALD-apparatus comprises a plurality of multi-way valve assemblies, each multi-way valve assembly being fluidly connected to one gas channel of the plurality of gas channels of the showerhead, wherein each multi-way valve assembly is switchable to fluidly connect the respective gas channel that is fluidly connected to the multi-way valve assembly with a selected one of a plurality of different gas sources which supply different types of gas,
wherein the showerhead has outer ring openings which are circumferentially and radially outwardly of the showerhead section openings, the outer ring openings defining an outer ring section extending along the entire circumference of the showerhead in the showerhead side adjacent a radial outer edge of the showerhead side, wherein the outer ring openings are fluidly connected to at least one of an exhaust and a purge gas source.

2. The SALD apparatus according to claim 1, wherein each multi-way valve assembly is switchable to fluidly connect the respective gas channel that is fluidly connected to the respective multi-way valve assembly with a gas exhaust.

3. The SALD apparatus according to claim 1, wherein the at least one showerhead section opening of a respective showerhead section comprises a plurality of showerhead section openings that are distributed over a surface area of the showerhead side that corresponds with a section area that radially extends from a central region of the showerhead side to a circumferential region of the showerhead side.

4. The SALD apparatus according to claim 1, wherein the at least one showerhead section opening of a said showerhead section opens into a central region of the showerhead side, and wherein each showerhead section comprises at least one exhaust opening that opens into the circumferential region of the showerhead side such that in use, a radially outwardly directed gas flow within the gap is associated with each showerhead section.

5. The SALD apparatus according to claim 3, wherein the at least one showerhead section opening of a respective showerhead section opens into the circumferential region of the showerhead side, wherein each showerhead section comprises at least one central exhaust opening that opens into the central region of the showerhead side, such that in use, a radially inwardly directed gas flow within the gap is associated with each showerhead section.

6. The SALD apparatus according to claim 5, including:
a central exhaust channel extending along the axis of rotation (A) in at least one of the showerhead and the susceptor which central exhaust channel opens with one end in said gap and is connected with another end to an exhaust;
wherein the at least one central exhaust opening of each showerhead section is formed by a radially inner side of a gap section defined by a respective showerhead section which radially inner side is in direct communication with the central exhaust channel.

7. The SALD apparatus according to claim 5, wherein the showerhead includes a circumferential wall that substantially closes off a radial outward boundary of the gap, wherein the at least one showerhead section opening of a respective showerhead section is accommodated in the circumferential w all.

8. The SALD apparatus according to claim 1, wherein the showerhead is mounted rotatably around the central axis (A) for effecting the relative rotation between the showerhead and the susceptor during processing of substrates.

9. The SALD apparatus according to claim 1, wherein the susceptor is mounted rotatably around the central axis (A) for effecting the relative rotation between the showerhead and the susceptor during processing of substrates and wherein the showerhead is non-rotatably mounted.

10. The SALD apparatus according to claim 1, wherein, the showerhead is configured to create zones in the gap by switching the multi-way valve assemblies of the respective showerhead sections in a desired position so as to connect each showerhead section with a desired gas source or an exhaust, wherein each zone, includes at least one showerhead section in a tangential direction around the central axis (A).

11. The SALD-apparatus according to claim 10, wherein within the gap a plurality of different zones are present that subsequently include, when view ed in a tangential direction around the central axis (A), a first precursor gas zone, a gas exhaust zone, a purge gas zone, a gas exhaust zone, a second precursor gas zone, a gas exhaust zone, a purge gas zone and a gas exhaust zone.

12. The SALD apparatus according to claim 1, wherein the multi-way valve of each of the showerhead sections has at least a main connection and at least three branch connections, wherein the main connection is connected to a gas conduit which is fluidly connected to one gas channel of the plurality of gas channels of the showerhead wherein the three branch connections are fluidly connected to respectively:
a first precursor gas source;
a second precursor gas source; and
a purge gas source.

13. The SALD apparatus according to claim 12, wherein each multi-way valve has one additional, fourth branch connection which is fluidly connected to a gas exhaust.

14. The SALD apparatus according to claim 13, wherein each multi-way valve has at least two additional, fifth and sixth branch connections, wherein the fifth branch connection is fluidly connected to a third precursor gas source and the sixth branch connection is fluidly connected to a fourth precursor gas source.

15. The SALD apparatus according to claim 3, wherein the showerhead side includes a second plurality of section openings which are permanently connected to a single gas source or to an exhaust so as to define non-switchable sections that extend substantially radially from the central region to the circumferential region, wherein each non-switchable section is positioned between two showerhead sections that are each associated with a respective multi-way valve assembly.

16. The SALD apparatus according to claim 1, wherein at least one of the showerhead and the susceptor is upwardly and downwardly moveable, such that height of the gap is adjustable.

17. A Spatial Atomic Layer Deposition (SALD) apparatus, wherein the SALD apparatus includes:
a susceptor having a substrate support surface on which substrates can be placed; and
a showerhead having a showerhead side that extends substantially parallel to the substrate support surface to form a gap between the substrate support surface and the showerhead side;

wherein the susceptor and the showerhead are rotatable relative to each other around a central axis of rotation (A) that intersects a center of the showerhead and that extends substantially perpendicularly to the substrate support surface;
wherein the showerhead includes a plurality gas channels, wherein each gas channel is fluidly connected with at least one showerhead section opening in the showerhead that opens into the gap for at least one of supplying gas into and exhausting gas from the gap, wherein each gas channel with the at least one showerhead section opening to which it is fluidly connected defines a showerhead section so that the showerhead includes a plurality of showerhead sections;
wherein the SALD-apparatus comprises a plurality of multi-way valve assemblies, each multi-way valve assembly being fluidly connected to one gas channel of the plurality of gas channels of the showerhead, wherein each multi-way valve assembly is switchable to fluidly connect the respective gas channel that is fluidly connected to the multi-way valve assembly with a selected one of a plurality of different gas sources which supply different types of gas,
wherein the showerhead has inner ring openings which are circumferentially and radially inwardly of the showerhead section openings, the inner ring openings defining an inner ring section extending along the entire circumference of the showerhead in the showerhead side adjacent a radial inner edge of the showerhead side, wherein the inner ring openings are fluidly connected to at least one of an exhaust and a purge gas source.

18. The SALD apparatus according to claim 17, wherein the at least one showerhead section opening of a respective showerhead section comprises a plurality of showerhead section openings that are distributed over a surface area of the showerhead side that corresponds with a section area that radially extends from a central region of the showerhead side to a circumferential region of the showerhead side.

19. The SALD apparatus according to claim 17, wherein, the showerhead is configured to create zones in the gap by switching the multi-way valve assemblies of the respective showerhead sections in a desired position so as to connect each showerhead section with a desired gas source or an exhaust, wherein each zoneincludes at least one showerhead section in a tangential direction around the central axis (A).

20. The SALD apparatus according to claim 17, wherein the multi-way valve of each of the showerhead sections has at least a main connection and at least three branch connections, wherein the main connection is connected to a gas conduit which is fluidly connected to one gas channel of the plurality of gas channels of the showerhead wherein the three branch connections are fluidly connected to respectively:
a first precursor gas source;
a second precursor gas source; and
a purge gas source.

* * * * *